United States Patent [19]
Izuhara

[11] Patent Number: 5,497,155
[45] Date of Patent: Mar. 5, 1996

[54] ANALOG TO DIGITAL CONVERTOR APPARATUS HAVING AN INTERPOLATION

[75] Inventor: Kunihiko Izuhara, Kanagawa, Japan

[73] Assignee: Sony Corporation, Tokyo, Japan

[21] Appl. No.: 129,606

[22] Filed: Sep. 30, 1993

[30] Foreign Application Priority Data

Sep. 30, 1992 [JP] Japan ................... 4-285415
Sep. 30, 1992 [JP] Japan ................... 4-285416
Sep. 30, 1992 [JP] Japan ................... 4-285522
Sep. 30, 1992 [JP] Japan ................... 4-285523

[51] Int. Cl.⁶ .................................. H03M 1/14
[52] U.S. Cl. ........................... 341/156; 327/89
[58] Field of Search ....................... 341/156, 158, 341/159; 307/350, 358, 362; 327/77, 85, 87, 89

[56] References Cited

U.S. PATENT DOCUMENTS 4,831,379  5/1989  van de Plassche ............ 341/156
5,126,742  6/1992  Schmidt et al. ............... 341/156
5,151,700  9/1992  Matsuzawa et al. ........... 341/156

Primary Examiner—Marc S. Hoff
Attorney, Agent, or Firm—Hill, Steadman & Simpson

[57] ABSTRACT

An analog-to-digital convertor apparatus finds input signals of a comparison output to a virtual reference potential between reference potentials with significantly fewer elements in the comparator than in the prior art. A composite inverted output current and a composite in-phase output current are generated by adding the in-phase comparison output current of the first and second comparison output currents of an input signal to the first and second reference signals. Then, an interpolation output means compares the generated composite output currents with a comparison output current which is opposite in phase to these composite output signals. This enables the comparator circuit to obtain the result of comparison of the input signal to a virtual reference signal existing between the first and second reference signals.

12 Claims, 30 Drawing Sheets

ANALOG TO DIGITAL CONVERTOR APPARATUS HAVING AN INTERPOLATION

BACKGROUND OF THE INVENTION

1. Field of the Invention

This invention relates generally to a comparator circuit, and in particular to, for example, a comparator circuit which is used in a comparison input stage of an analog-to-digital convertor circuit for sequentially converting analog signals to digital signals, and outputting them.

2. Description of the Related Art

Conventionally, in the fields of audio equipment and instrumentation, an analog-to-digital convertor circuit (hereinafter called an "A/D convertor circuit") is used widely to convert various analog signals such as audio signals to be recorded or reproduced into digital data for digital signal processing. There are various conversion methods in the A/D convertor circuit, and these are used in various application fields depending on accuracy and speed requirements.

In particular, when high speed operation or high accuracy is required, it is usual to use a parallel (flash) type A/D convertor circuit or a serial-parallel (subranging) type A/D convertor circuit, for which a resolution of 10 to 12 bits is required.

However, when the resolution is as low as 10 to 12 bits, voltage for the least significant bit (1 LSB) necessary for the A/D convertor circuit becomes very low (about 1 mV) so that the influence of the voltage difference ΔVBE between the base and the emitter of transistors constituting the comparator cannot be ignored.

Thus, an interpolation method is proposed in which a plurality of comparison outputs generated by a comparator are combined and compared to interpolatively find a comparison output between a virtual potential corresponding to the middle of the reference potential and an input signal VIN so as to reduce the number of comparators with this interpolation processing.

As one of such interpolation methods, an interpolation method is proposed in which the load resistances of a differential amplifier circuit constituting a comparator are arranged as a resistance array having a predetermined resistance ratio, to which an output voltage found as a difference voltage between the connection taps of each resistor is combined to obtain a comparison output between the virtual potential that is equally dividing the reference potential and an input signal.

However, in this case, there is a problem in that one additional differential amplifying stage becomes necessary for interpolation, and that there arises a time difference in the speed of the differential output from the difference in time constants because a plurality of differential outputs are generated by using resistors with different resistance values. Thus, this method cannot be used in a parallel type A/D convertor circuit.

On the other hand, an interpolation method not causing such time difference in the speed of differential outputs is proposed in which a collector current is divided by various current ratios and the divided collector currents are combined to obtain a comparison output between the virtual potential that results from the equal division of the reference potential and an input signal.

When a comparator which is obtained by interpolating a comparison output between the virtual potential, for example, that equally divides the reference potential by four and an input signal $V_{IN}$, it becomes such an arrangement as shown in FIG. 1.

In this case, a differential input stage 1 inputs an input signal $V_{IN}$ and a reference potential $V_{REF1}$ into a differential pair consisting of transistors Q1 and Q2 and compares them to divide the collector currents into mutually inverted signals which are a comparison between the input signal $V_{IN}$ and the reference potential $V_{REF1}$ according to emitter area ratios of cascade connected transistors. Here, transistors Q3, Q4, Q5, Q6, Q7, Q8, and Q9, as well as Q9N, Q8N, Q7N, Q6N, Q5N, Q4N, and Q3N each set of which has an emitter area ratio of 1:2:3:4:3:2:1 are connected to the transistors Q1 and Q2.

Similarly, a differential input stage 2 inputs a reference potential $V_{REF2}$ and the input signal $V_{IN}$ into a differential pair consisting of the transistors Q21 and Q22 and compares them to divide the collector currents, which are its comparison outputs in mutually inverted signals, according to emitter area ratios of the cascade connected transistors. Here, transistors Q23, Q24, Q25, Q26, Q27, Q28, and Q29, as well as Q29N, Q28N, Q27N, Q26N, Q25N, Q24N, and Q23N each set of which has an emitter area ratio of 1:2:3:4:3:2 are connected to the transistors Q21 and Q22.

Namely, the transistors Q6 to Q9 and Q6N to Q3N (Q26 to Q23 and Q26N to Q23N) divide the collector current into divided collector current IA4, IA3, IA2, and IA1, as well as IAN4, IAN3, IAN2, and IAN1 (IB4, IB3, IB2, and IB1, as well as IBN4, IBN3, IBN2, and IBN1) in proportion to the emitter area of each transistor.

This current dividing comparator is arranged to add a divided current generated by adjacent differential input stages so that all added values of the divided current in an non-inverted relationship are the same value, and to compare their comparison outputs.

Namely, as shown in FIG. 2, a comparison output between the reference potential $V_{REF1}$ and the input signal $V_{IN}$ can be achieved by comparing the output potential VA1 and VB1 generated in load resistors R1 and R5 through which the divided collector current IA4 and IAN4 flow, respectively. Also, as shown in FIG. 3, a comparison output between the virtual reference potential V1 (=$V_{REF1}$ +ΔV/4) and the input signal $V_{IN}$ can be achieved by comparing an output potential VA2 generated in the load resistor R2 through which the composite collector current of the divided collector current IA3 and IB1 flows, and an output potential VB2 generated in the load resistor R6 through which the composite collector current of the divided collector current IAN3 and IBNL flows.

Similarly, as shown in FIG. 4, a comparison output between the virtual reference potential V2(=$V_{REF1}$+ΔV/2) and the input signal $V_{IN}$ can be obtained by comparing an output potential VA3 generated in a load resistor R3 through which the composite collector current of the divided collector currents IA2 and IB2 flows, and an output potential VB3 generated in a load resistor R7 through which the composite collector current of the divided collector currents IAN2 and IBN2 flows. Also, as shown in FIG. 5, a comparison output between the virtual reference potential V3 (=$V_{REF1}$ ∓ΔV/4) and the input signal $V_{IN}$ can be obtained by comparing an output potential VA4 generated in the load resistor R4 through which the composite collector current of the divided collector currents IA1 and IB3 flows, and an output potential VB4 generated in load resistor R8 through which composite collector current of the divided collector currents IAN1 and IBN3 flows.

Then, as shown in FIG. 6, a comparison output of the input signal $V_{IN}$ to the reference potential $V_{REF2}$ can be obtained by comparing the output potentials VA1 and VB1 generated in the load resistors R21 and R25 through which the divided collector currents IB4 and IBN4 flow, respectively.

In this way, when a result is obtained from the comparison between the virtual reference potential (V1, V2, and V3) dividing the reference potential $V_{REF1}$ and $V_{REF2}$ by four*, and the input signal $V_{IN}$ based on a result of the comparison between the comparison output which is obtained by adding two non-inverted outputs of the comparison outputs of the adjacent comparators in a certain ratio, and the comparison output which is obtained by adding two inverted outputs, it becomes necessary to have 14 transistors (Q3 to Q9 and Q3N to Q9N) with different ratios of emitter areas.

However, if it is intended to separately build the transistors in different emitter area ratios (that is, Q3:Q4:Q5:Q6:Q7:Q8:Q9=1:2:3:4:3:2:1) in the accuracy necessary for the comparator, it is necessary to parallel connect the transistors with the same emitter size in the number of ratios.

Therefore, if it is intended to perform interpolation for dividing the reference potential $V_{REF1}$ and $V_{REF2}$ by four by dividing the current in a predetermined ratio, 32 current dividing transistors are required for one comparator. If it is intended to perform interpolation for dividing the current of the reference potential $V_{REF1}$ and $V_{REF2}$ by eight, as much as 128 transistors of the same size are required for one comparator. This causes a problem in that the area of the circuit for the comparator is inevitably increased.

The principles of the serial/parallel A/D convertor will be described using FIG. 7.

This serial/parallel A/D convertor circuit is to convert an input signal $V_{IN}$ to digital data by dividing them into two stages of the upper and lower bits. Even in such type of serial/parallel A/D convertor, a two step parallel A/D convertor circuit 10 is mainly used when image signals are to be processed.

This A/D convertor circuit 10 generates reference voltages VU1, VU2, and VU3 corresponding to the upper two bits by a reference voltage generator circuit 11 which is constituted by serially connecting 16 reference resistors R. These three sets of reference voltage VU1, VU2, and VU3 are compared with the input signal $V_{IN}$ by upper comparators CU1, CU2, and CU3. The most significant bit D1 is generated by supplying their comparison outputs to an upper encoder 12.

The upper encoder 12 is arranged to generate a reference voltage for segmenting a voltage zone to which the upper two bits belong, and eight reference voltages VD1, VD2, . . . , VD8 in total for correcting redundancy provided for the upper and lower sides of the voltage zone by switching a group of switches SW based on the comparison outputs of the upper comparators CU1, CU2, and CU3.

It is arranged to compare these eight reference voltages VD1, VD2, . . . , VD8 with the input signal $V_{IN}$ at the lower comparators CD1, CD2, . . . , CD8, and to supply these comparison outputs to the lower encoder 13 so that the remaining three bits D2, D3, and D4 are generated.

However, when the resolution becomes as low as 10 to 12 bits, the voltage for the least significant bit (1 LSB) necessary for the A/D convertor circuit 10 becomes very low of about 1 mV so that an influence of the voltage difference ΔVBE between the base and the emitter of the transistors constituting the lower comparators CD1, CD2, . . . , CD8 cannot be ignored when the number of bits is increased.

Thus, an interpolation method is being studied in which a plurality of comparison outputs generated by a comparator are combined and compared to interpolatively find a comparison output between the intermediate potential of the adjacent reference potential and an input signal $V_{IN}$ so as to eliminate the influence of the voltage difference ΔVBE between the base and the emitter by reducing the number of comparators with this interpolation processing.

As one of such interpolation methods, an interpolation method is proposed in which load resistances of a differential amplifier circuit constituting a comparator are arranged as a resistance array. The resistance array is a plurality of resistances having a predetermined resistance ratio connected in series. The output voltage of the resistance array that is found as the difference voltage between the connection taps of each resistor is combined to obtain a comparison output between the intermediate potential dividing reference potential and an input signal.

However, in this case, there is a problem in that one additional differential amplifying stage becomes required for interpolation, and that there arises a time difference in the speed of the differential output due to the difference in time constants because a plurality of differential outputs are generated by using resistors with different resistance values. Thus, this method cannot be used in a low order comparator consisting of a serial/parallel A/D convertor circuit.

SUMMARY OF THE INVENTION

In view of the foregoing, the first object of this invention is to provide a comparator circuit that can obtain a comparison output between a plurality of virtual reference potentials for dividing a reference potential and an input signal with the number of elements which are much less than those in the prior art.

The second object of this invention is to propose an A/D convertor circuit with a comparator circuit that can obtain a comparison output between a plurality of virtual reference potentials for dividing the reference potential and an input signal with the number of elements which are much less than those in the prior art.

The third object of this invention is to significantly reduce the number of transistors necessary for constituting the comparator circuit than those in the prior art, by comparing respectively the first and second non-inverted comparison output currents, which are inverted compared to the composite output currents, and/or the first and second inverted comparison output currents, and at the same time, to reduce the area of the comparator circuit which can obtain a result of comparison between the input signals and the virtual reference signals existing between the first and second reference signals.

The fourth object of this invention is to significantly reduce the number of transistors necessary for constituting the comparator circuit than those in the prior art, by comparing either one of a composite non-inverted output currents, which is a sum of the first and second non-inverted comparison output currents in a predetermined ratio, or a composite inverted output current, which is a sum of the first and second inverted comparison output currents in a predetermined ratio, with the comparison output currents in an inverted relation to the composite output current, and at the same time, to reduce the area of the comparator circuit which can obtain a result of the comparison between the input signals and the virtual reference signals existing between the first and second reference signals.

The fifth object of this invention is to significantly reduce the number of transistors necessary for constituting the comparator circuit than those in the prior art, in the interpolation output stage of the lower comparison section of the analog-to-digital convertor circuit, by comparing respectively the first and second non-inverted comparison output currents, which are of inverted compared to the composite output current, or the first and second inverted comparison output currents, and as a result, to reduce the area of the analog-to-digital convertor circuit.

The sixth object of this invention is to significantly reduce the number of transistors necessary for the comparator circuit compared to the comparators of the prior art, in the interpolation output stage of the lower comparison section of the analog-to-digital convertor circuit, by comparing either one of a composite non-inverted output current, which is a sum of the first and second non-inverted comparison output currents in a predetermined ratio, or a composite inverted output current, which is a sum of the first and second inverted comparison output currents in a predetermined ratio, with the comparison output currents having an inverted relation relative to the composite output current, and at the same time, to reduce the area of the analog-to-digital convertor circuit which can obtain a result of the comparison between the input signals and the virtual reference signals existing between the first and second reference signals.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

Preferred embodiments of this invention will be described with reference to the accompanying drawings:

First, referring to FIG. 8, principles of the present invention will be described.

In this case, comparison outputs between a plurality of virtual reference potentials between two reference potentials and an input signal can be found by comparing a composite current which is the sum of a predetermined ratio of two sets of non-inverted outputs from a comparator, into which the input signal $V_{IN}$ and the reference potential $V_{REF1}$ are inputted, and a comparator, into which the input signal $V_{IN}$ and reference potential $V_{REF2}(=V_{REF1}+\Delta V)$ are inputted, with one of two sets of opposite inverted outputs.

Figure 1:
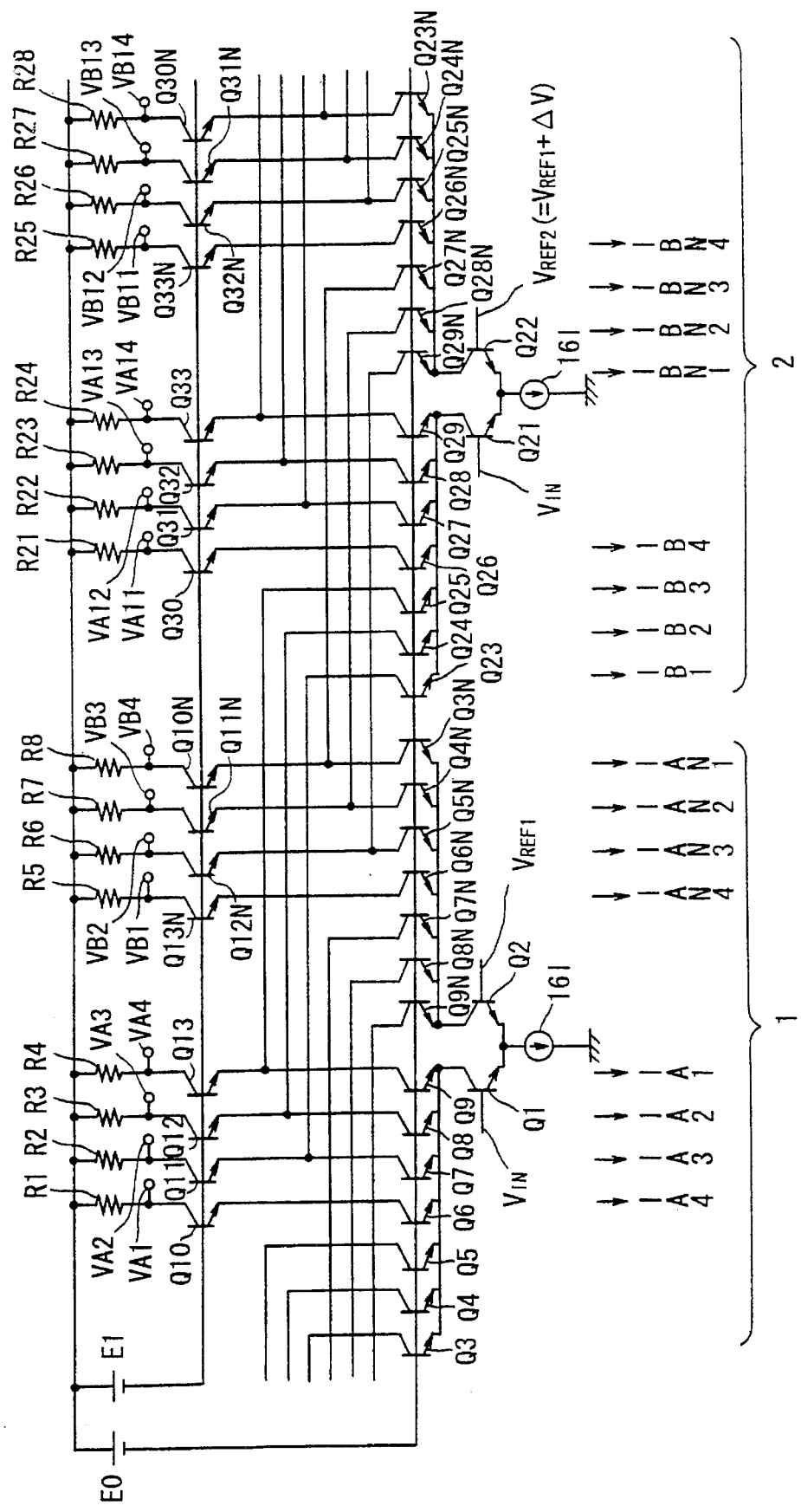
FIG. 1 is a circuit diagram of a conventional comparator circuit using an interpolation method.
Figure 2:
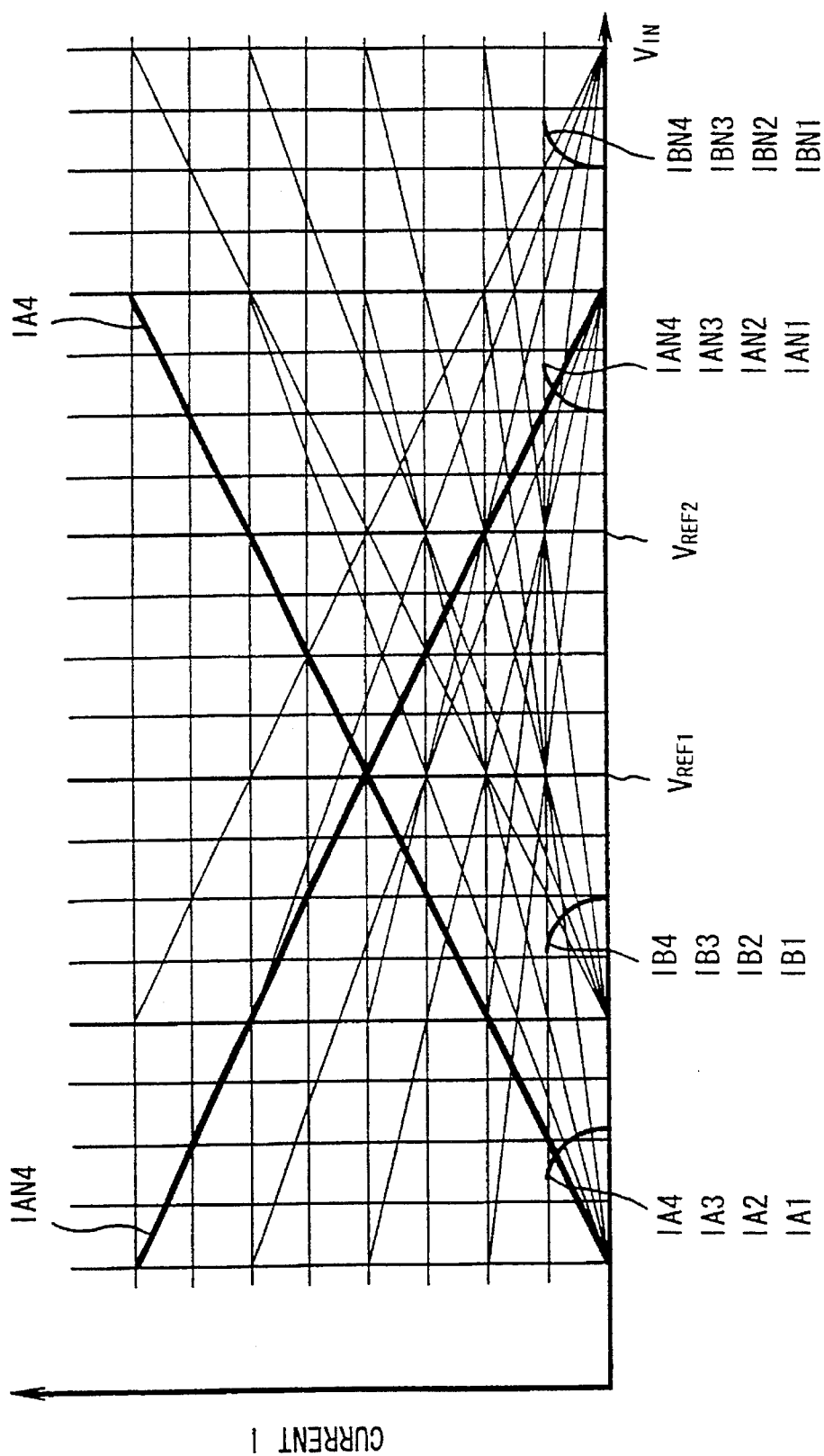
FIGS. 2 to 6 are characteristic curve diagrams for the explanation of the operation of the comparator shown in FIG. 1.
Figure 3:
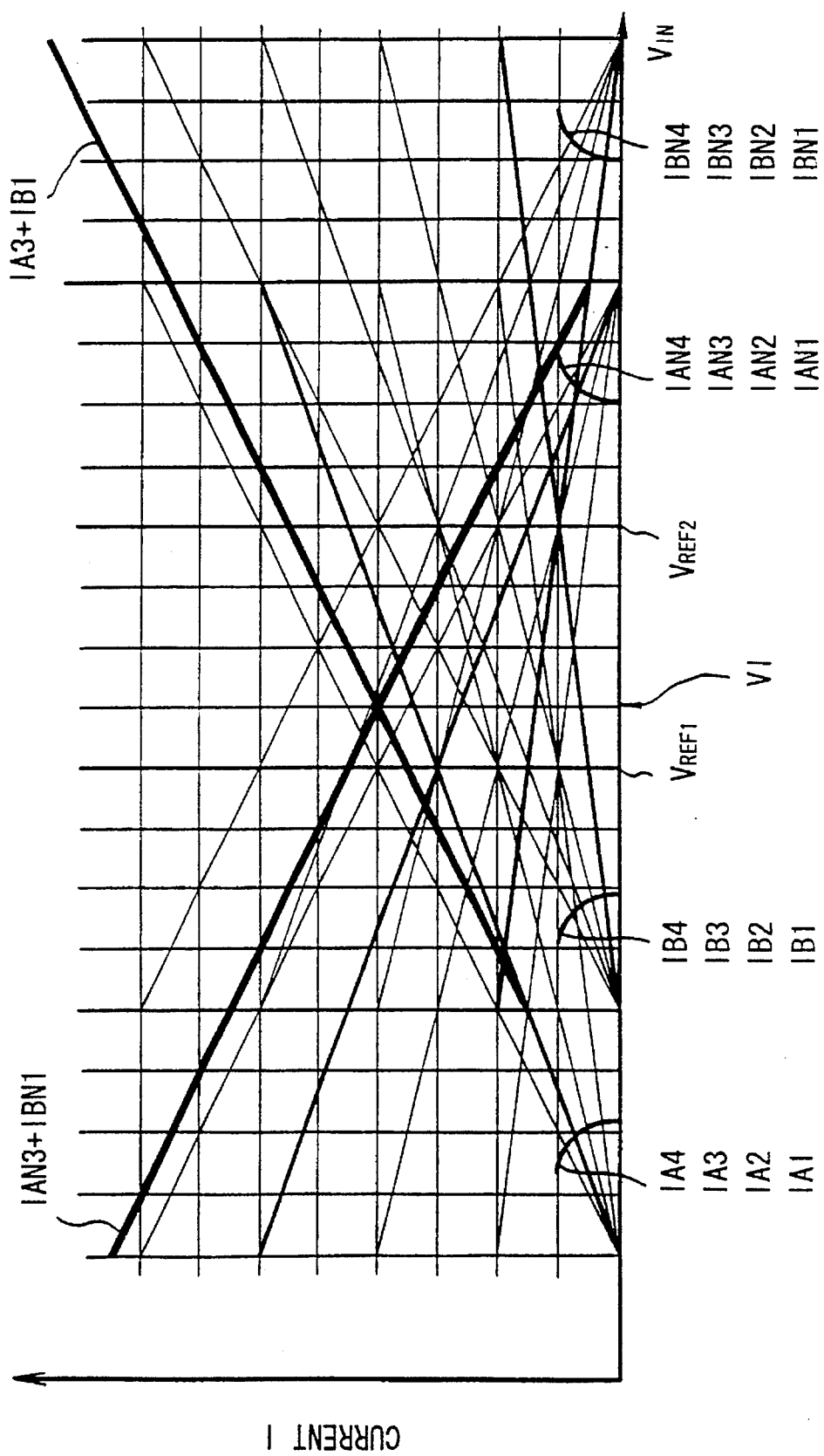
Figure 4:
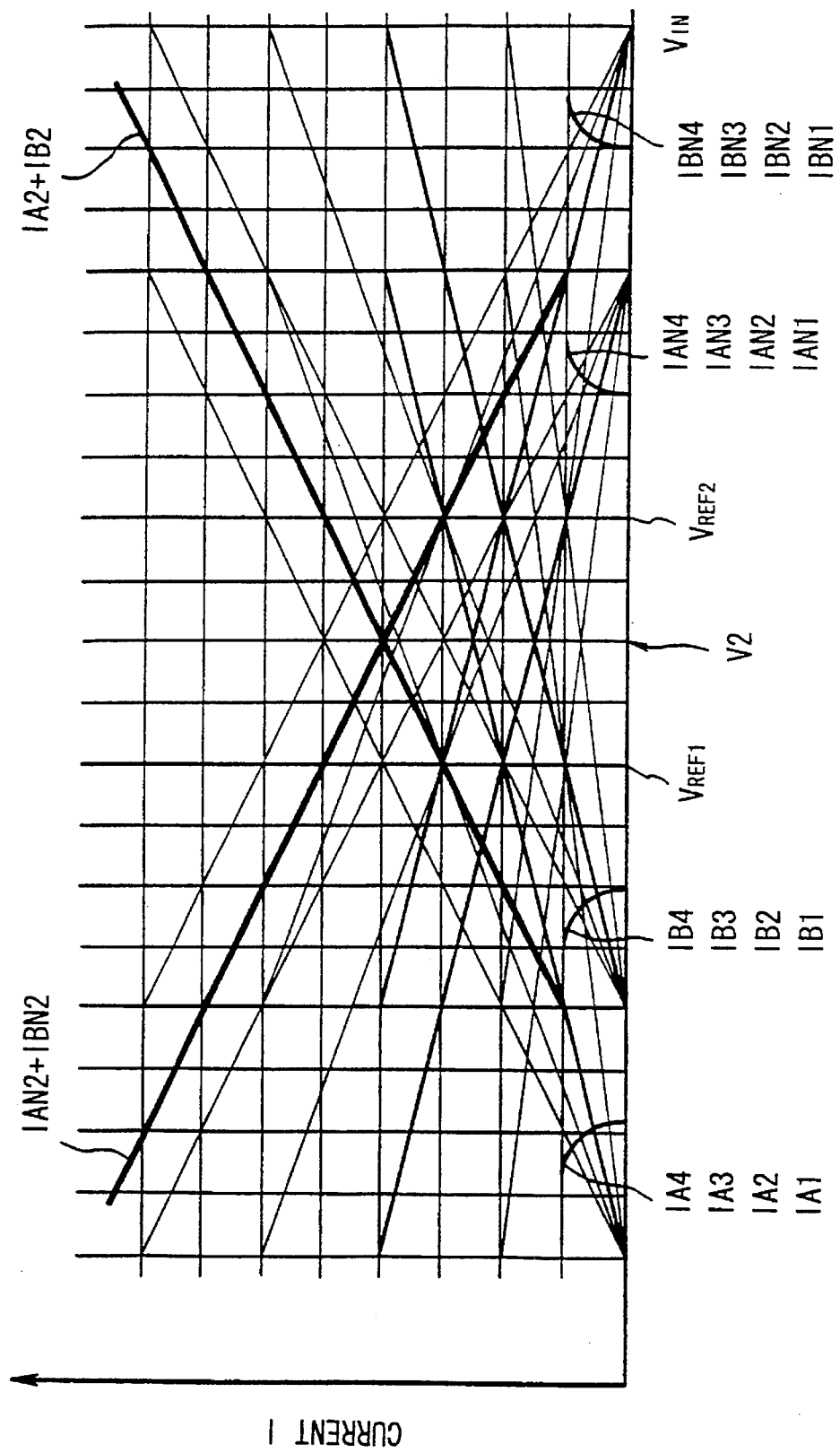
Figure 5:
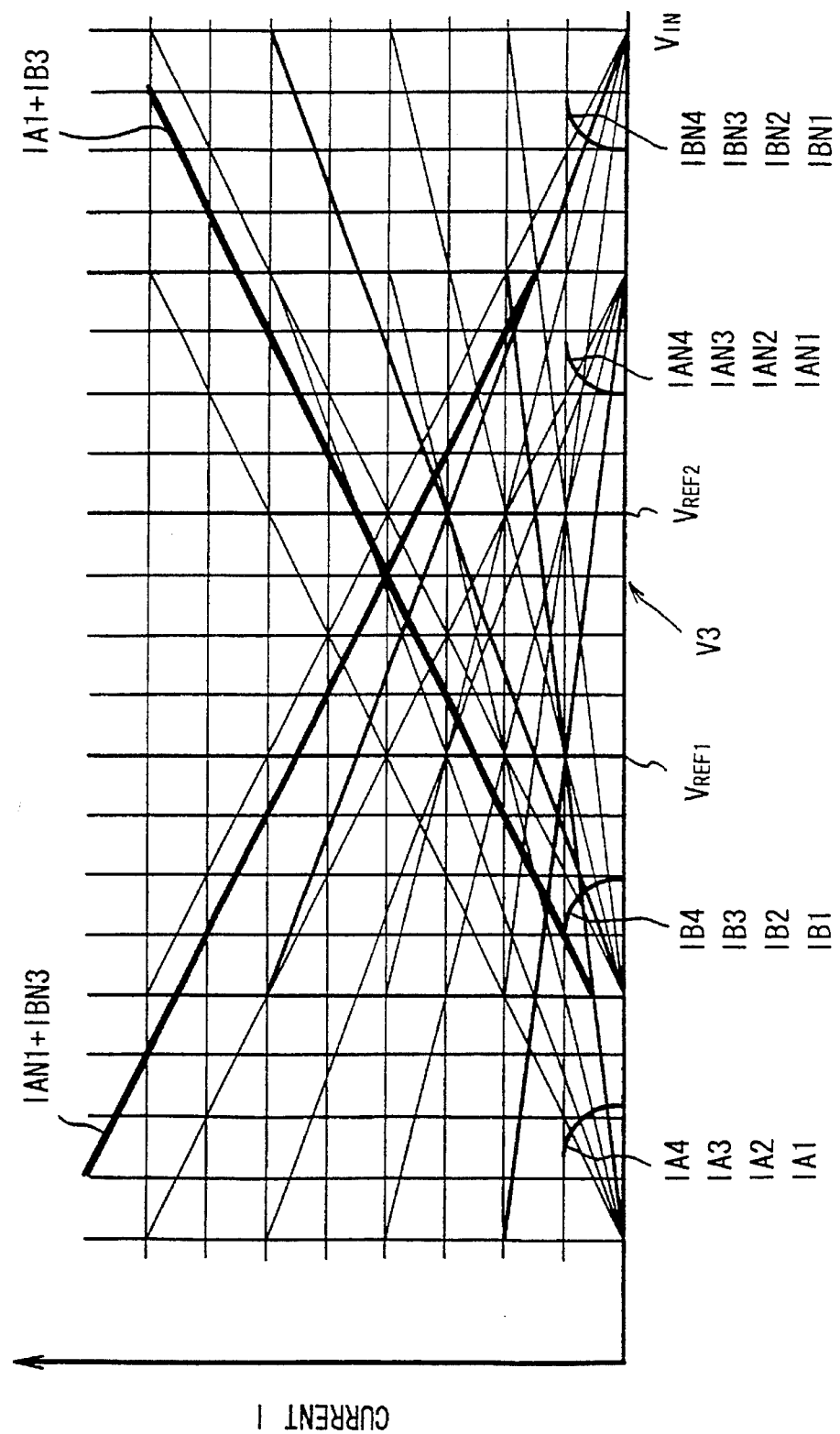
Figure 6:
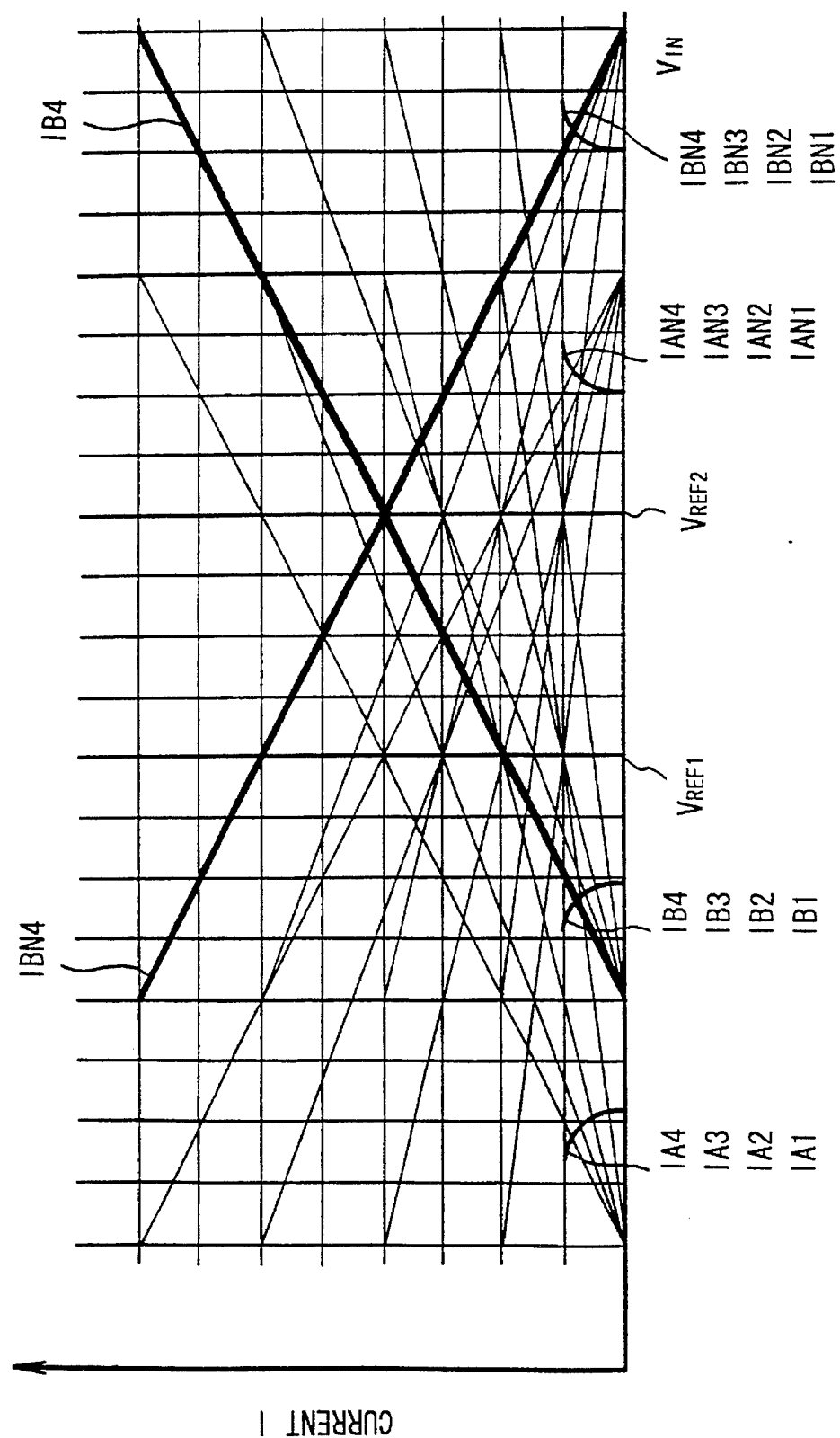
Figure 7:
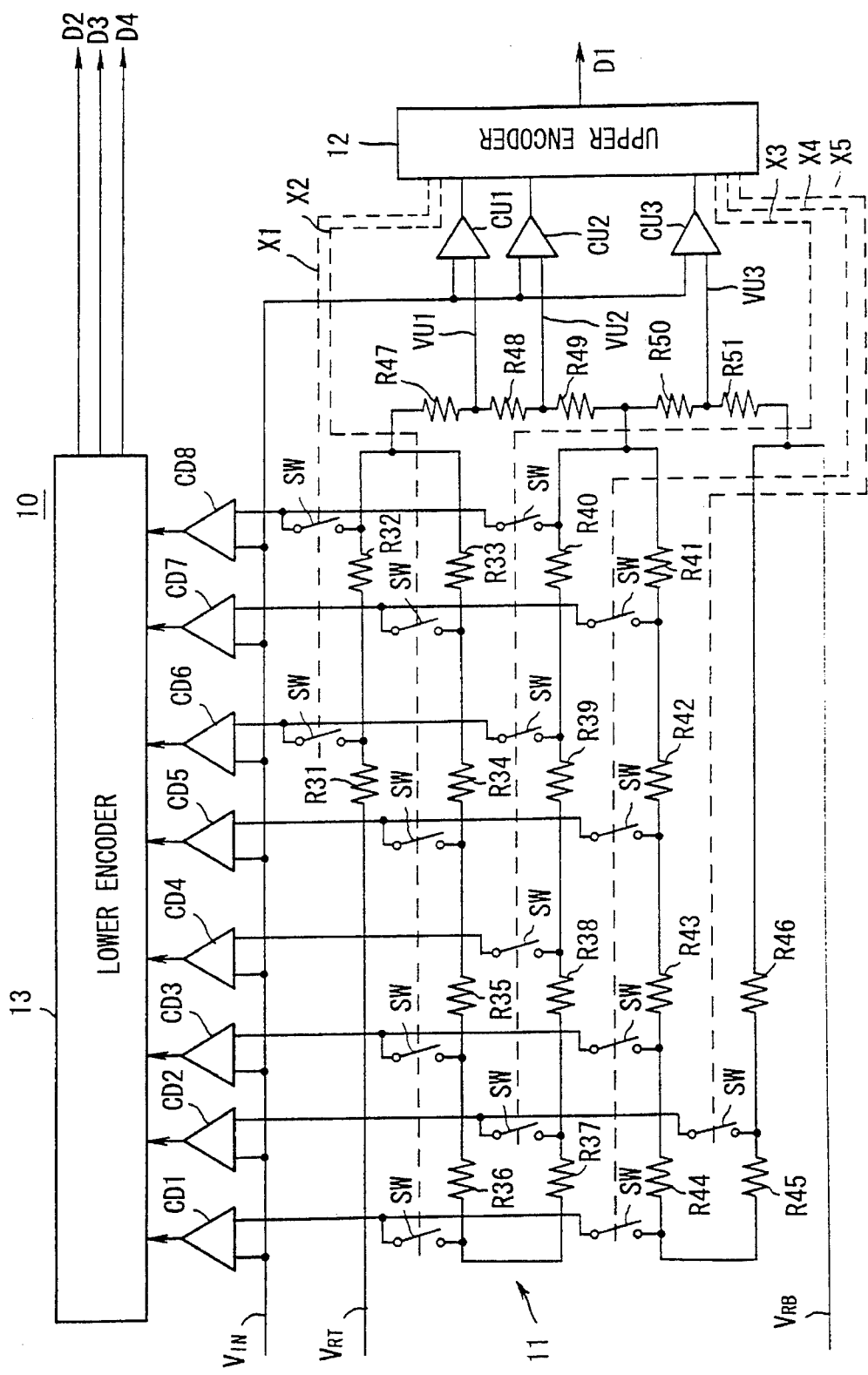
FIG. 7 is a schematic view showing a conventional serial/parallel A/D convertor, generally.
Figure 8:
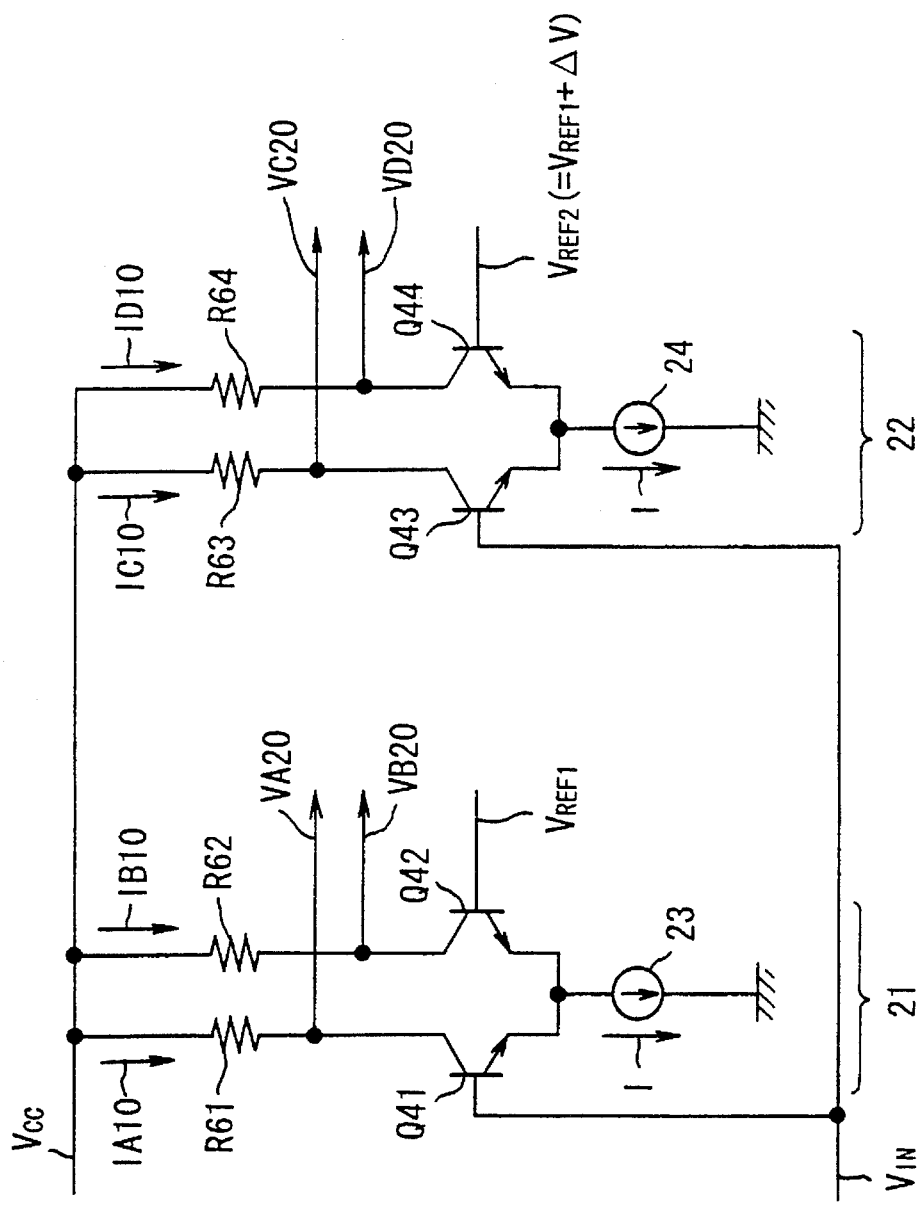
FIG. 8 is a circuit diagram of comparator for explaining the principles embodied in the present invention.

This principle will be explained with two sets of a differential pair 21 and a differential pair 22 as shown in FIG. 8. In this case, the differential pair 21 consists of transistors Q41 and Q42, into the bases of which an input signal $V_{IN}$ and the reference potential $V_{REF1}$ are inputted. The differential pair 22 consists of transistors Q43 and Q44, into the bases of which the input signal $V_{IN}$ and the reference potential $V_{REF2}$ are inputted.

Figure 9:
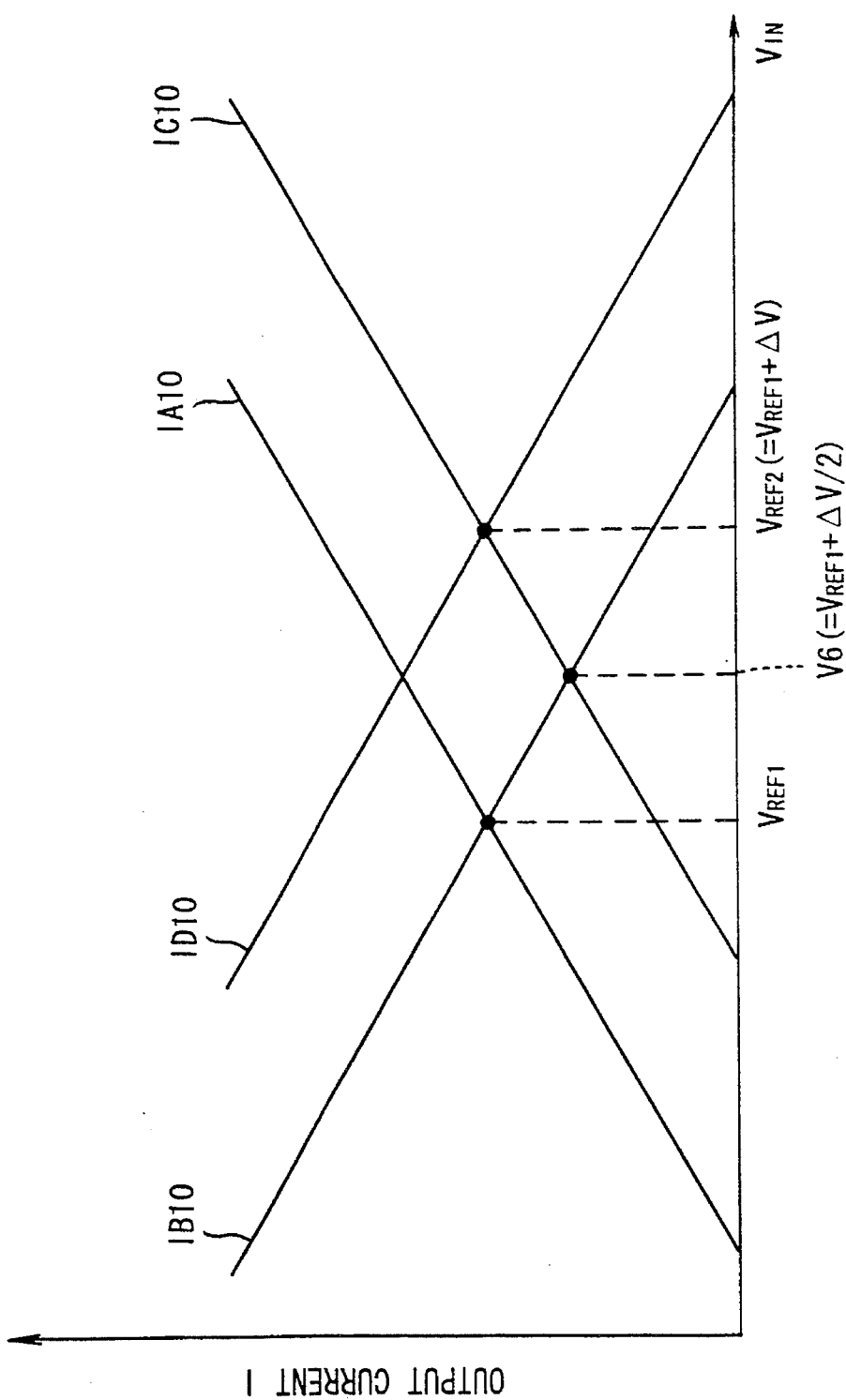
FIGS. 9 to 11 are characteristic curve diagrams for explaining the operation of the comparator shown in FIG. 8.

Here, if it is assumed that the collector currents flowing through the transistors Q41, Q42, and Q43, Q44 are IA10, IB10, and IC10, ID10, respectively, the current values of the collector currents IA10, IB10, and IC10, ID10 are inverted with at the reference potential $V_{REF1}$ and $V_{REF2}$ as the boundary, respectively, as shown in FIG. 9.

Therefore, it is possible to obtain a comparison output of the input signal $V_{IN}$ to the reference potential VRFE1 by comparing the output voltages VA20 and VB20, which generate in the load resistors R61 and R62, through which the collector currents IA10 and IB10 flow, with the comparator.

In addition, it is possible to obtain a comparison output of the input signal $V_{IN}$ to the reference potential $V_{REF2}$ by comparing output voltages VC20 and VD20, which generate in the load resistors R63 and R64, through which the collector currents IC10 and ID10 flow, with a comparator.

Similarly, the collector currents IA10 and ID10 are inverted at the boundary of the intermediate potential V6 ($=V_{REF1}+\Delta V/2$) of the reference potential $V_{REF1}$ and the reference potential $V_{REF2}$ ($=V_{REF1}+\Delta V$). Also, the collector currents IB10 and IC10 are inverted at the boundary of the intermediate potential V6 ($=V_{REF1}+\Delta V/2$) of the reference potential $V_{REF1}$ and the reference potential $V_{REF2}$ ($=V_{REF1}+\Delta V$). Thus, it is possible to obtain a comparison output of the input signal $V_{IN}$ to the virtual reference potential V6 ($=V_{REF1}+\Delta V/2$) by comparing the output voltages VA20 and VD20 or the output voltages VB20 and VC20 with a comparator.

Next, we consider how to obtain a comparison output of the input signal $V_{IN}$ to a virtual reference potential which divides the reference potential $V_{REF1}$ and the reference potential $V_{REF2}$ ($=V_{REF1}+\Delta V$) by four by using this principle.

Here, three collector currents, IA10, IB10 and IC10, are used.

Figure 10:
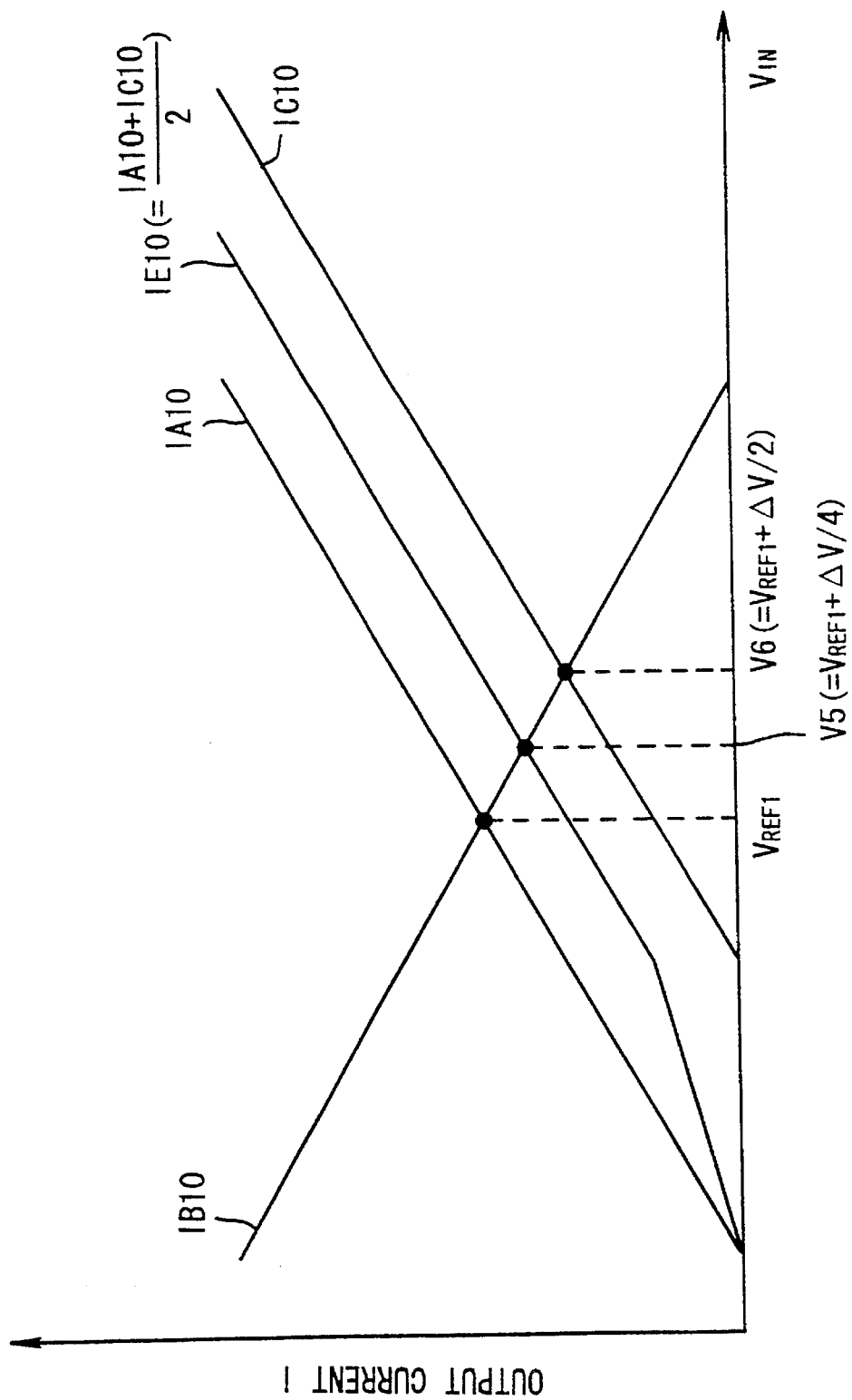

In this case, because the collector current linearly increases and decreases in a range with little difference voltage between the differential voltage and the collector current, the collector currents IA10 and IC10 of the non-inverted outputs of the differential pairs 21 and 22 become practically parallel, as shown in FIG. 10, and the collector current IB10 of an inverted output of the differential pair 21 intersects them in a range where it is considered to be practically a straight line.

Then, if it is possible to generate a composite collector current IE10 which is the sum of the collector currents IA10 and IC10 in a ratio of one to one (that is, IA10/2+IC10/2), this composite collector current IE10 can be represented as a line equidistant from both collector currents IA10 and IC10, and parallel to both collector currents IA10 and IC10 so that the collector current IB10 and the composite collector current IE10 are inverted at the virtual reference potential ($V_{REF1}\Delta V/4$) that is equally dividing the reference potentials $V_{REF1}$ and $V_{REF2}$ by four as a boundary.

Therefore, the comparison output of the input signal $V_{IN}$ to the virtual reference potential V5 ($=V_{REF1}+\Delta V/4$) can be obtained by comparing the output voltage VB20 that is generated from the collector current IB10 and the output voltage VE20 generated from the composite collector current IE10.

Figure 11:
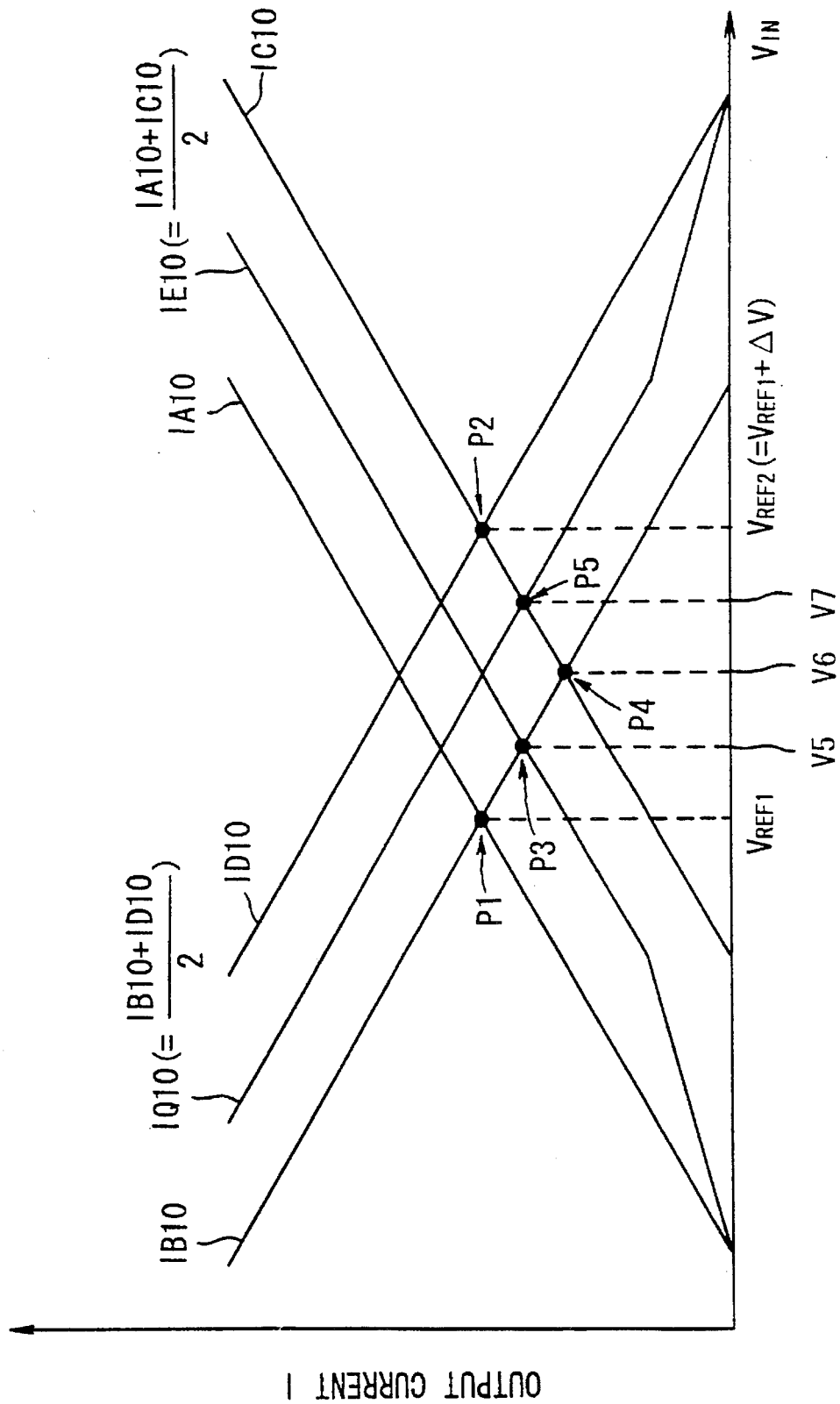

A similar relationship is, as shown in FIG. 11, also established for the three currents, the collector currents IB10, IC10, and ID10, so that a comparison output of the input signal $V_{IN}$ to a virtual reference potential V7 ($=V_{REF1}\mp\Delta V/4$) can be obtained by generating a composite collector current IQ10 which is the sum of the collector currents IB10 and ID10 at a ratio of half to half (that is, IB10/2+ID10/2), and comparing the output voltage VC generated from the collector current IC10 and the output voltage VQ10 generated from the composite collector current IQ10.

That is, in this embodiment, a comparison output of the input signal $V_{IN}$ to the virtual reference potentials V5, V6, and V7 equally dividing the reference potential $V_{REF1}$ and $V_{REF2}$ by four is interpolated under the principle that the composite collector currents IE10 and IQ10, which are composed of non-inverted outputs of two adjacent differential pairs 21 and 22 at a ratio of half to half, are compared with the collector currents IB10 and IC10 which are inverted outputs, respectively.

Next, the first embodiment is described below.

Figure 12:
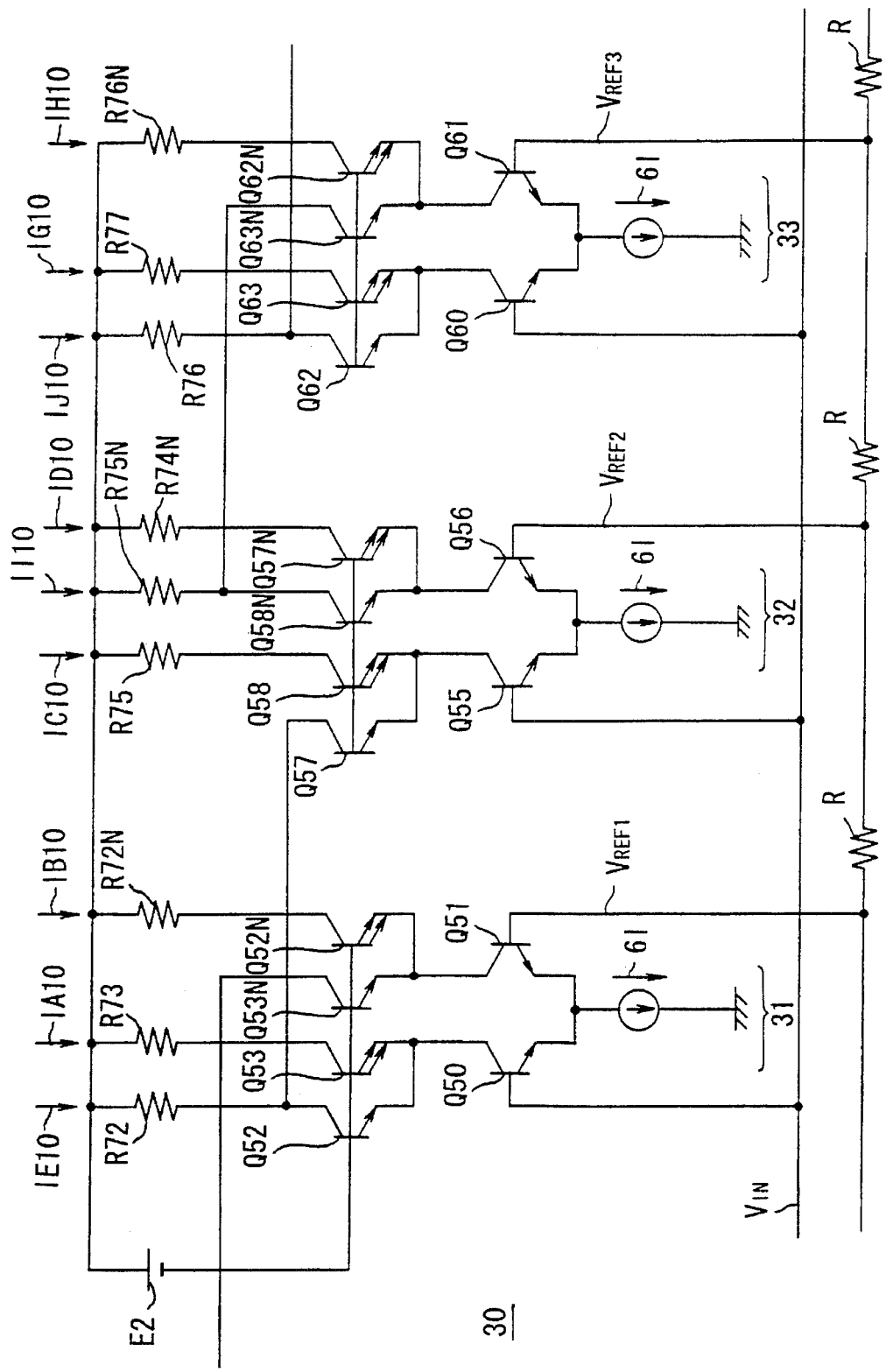
FIG. 12 is a circuit diagram of the comparator using an interpolation method in a first embodiment of the present invention.

In FIG. 12, element 30 generally indicates a basic arrangement of a four-dividing interpolation type comparator circuit. It is arranged to obtain a comparison output of the input signal V IN to the virtual reference potential, for equally dividing each reference potential $V_{REF1}$, $V_{REF2}$, and $V_{REF3}$ by four by dividing the collector current, which is a comparison output of each of reference potentials $V_{REF1}$, $V_{REF2}$, and $V_{REF3}$, and the input signal $V_{IN}$, at a current ratio of 1:2, and then combining and adding them.

In the case of this embodiment, each differential input stage 31, 32, and 33 constituting the comparator has the same arrangement as each other, in which a collector current corresponding to a signal level of the input signal $V_{IN}$ to each reference potential $V_{REF1}$, $V_{REF2}$, and $V_{REF3}$ is fed by inputting the input signal $V_{IN}$ to one of the transistors Q50, Q55, and Q60 constituting a differential pair, and supplying the reference potential $V_{REF1}$, $V_{REF2}$, and $V_{REF3}$ to other transistors Q51, Q56, and Q61.

In this case, the collectors of the transistors (Q50, Q51), (Q55, Q56), and (Q60, Q61) constituting the differential pair are cascade connected with base grounded current dividing transistors (Q52, Q53, Q53N, Q52N), (Q57, Q58, Q58N, Q57N), and (Q62, Q63, Q63N, Q62N) with an emitter area ratio of 1:2 to divide the comparison collector current according to an emitter area ratio.

Also, each differential input stage is commonly connected with the collectors of the current dividing transistors (Q52, Q57), and (Q58N, Q63N) of the adjacent differential input stages dividing the collector current by four to obtain an output voltage composed of one set of divided collector currents mutually in an inverted relationship.

Thus, when assuming that the divided collector current is flowing through the transistors Q53 and Q58 are IA10 and IC10, a load resistor R72 that is connected to the common collector of the transistors Q52 and Q57 is supplied with the composite collector current IE10 which is combination of the divided collector current IA10 and IC10 at the ratio of half to half (= IA10/2+IC10/2).

Similarly, when assuming that the divided collector current flowing through the transistors Q57N and Q62N is ID10 and IH10, a load resistor R75N connected to the common collector of the transistors Q58N and Q63N is supplied with the composite collector current II10 which is combination of the divided collector current ID10 and IH10 at the ratio of half to half (= ID10/2+IH10/2).

Thus, because each of the current dividing transistors (Q52, Q53, Q52N), (Q57, 058, Q57N), . . . is connected with the load resistors (R72, R73, R72N), (R72, R75, R74N), . . . with the same resistance value, each load resistor is provided with an output voltage corresponding to the divided collector current value divided in accordance with the emitter area ratio of the transistors and the composite current value.

In the case of this embodiment, the comparison output to the virtual reference potential dividing the potential between the reference potential $V_{REF1}$ and $V_{REF2}$ by four can be obtained by comparing the output voltage of each load resistor.

That is, the comparison output of the input signal $V_{IN}$ to the reference potential $V_{REF1}$ and $V_{REF2}$ can be obtained, respectively, by comparing the output voltage of the load resistors R72 and R72N, and by comparing the output voltage of the load resistors R75 and R74N.

Also, the comparison output of the input signal $V_{IN}$ to the virtual reference potential V12 (=$V_{REF1}+\Delta V/2$) for dividing the difference between two reference potential $V_{REF1}$ and $V_{REF2}$ can be obtained by comparing the output voltage of the load resistors R72N and R75.

The comparison output of the input signal $V_{IN}$ to the virtual reference potential V5 (=$V_{REF1}+\Delta V/4$) for dividing the difference between the reference potential $V_{REF1}$ and the intermediate reference potential V12 by two (that is, dividing the difference between the reference potential $V_{REF1}$ and $V_{REF2}$ by four) can be obtained by comparing the output voltage of the load resistor R72 through which the composite collector current IE10 flows and that of the load resistor R72N through which the divided collector current IB10 flows.

Similarly, the comparison output of the input signal $V_{IN}$ to the virtual reference potential V13 $V_{REF1} \mp \Delta V/4$) for dividing the difference between the reference potential $V_{REF2}$ and the intermediate reference potential V6 by two (that is, dividing the difference between the reference potential $V_{REF1}$ and $V_{REF2}$ by four) can be obtained by comparing the output voltage of the load resistor R72 through which the composite collector current IE10 flows and that of the load resistor R74N through which the divided collector current ID10 flows.

Thus, the comparison outputs of the input signal $V_{IN}$ to the virtual reference potentials V5 and V7 for dividing the difference between the reference potential $V_{REF1}$ and $V_{REF2}$ by four can be found by comparing the composite collector current IE10 inverted relative to the input signal $V_{IN}$ and the collector currents IB10 and ID10 in the opposite inverted relationship to it.

Figure 13:
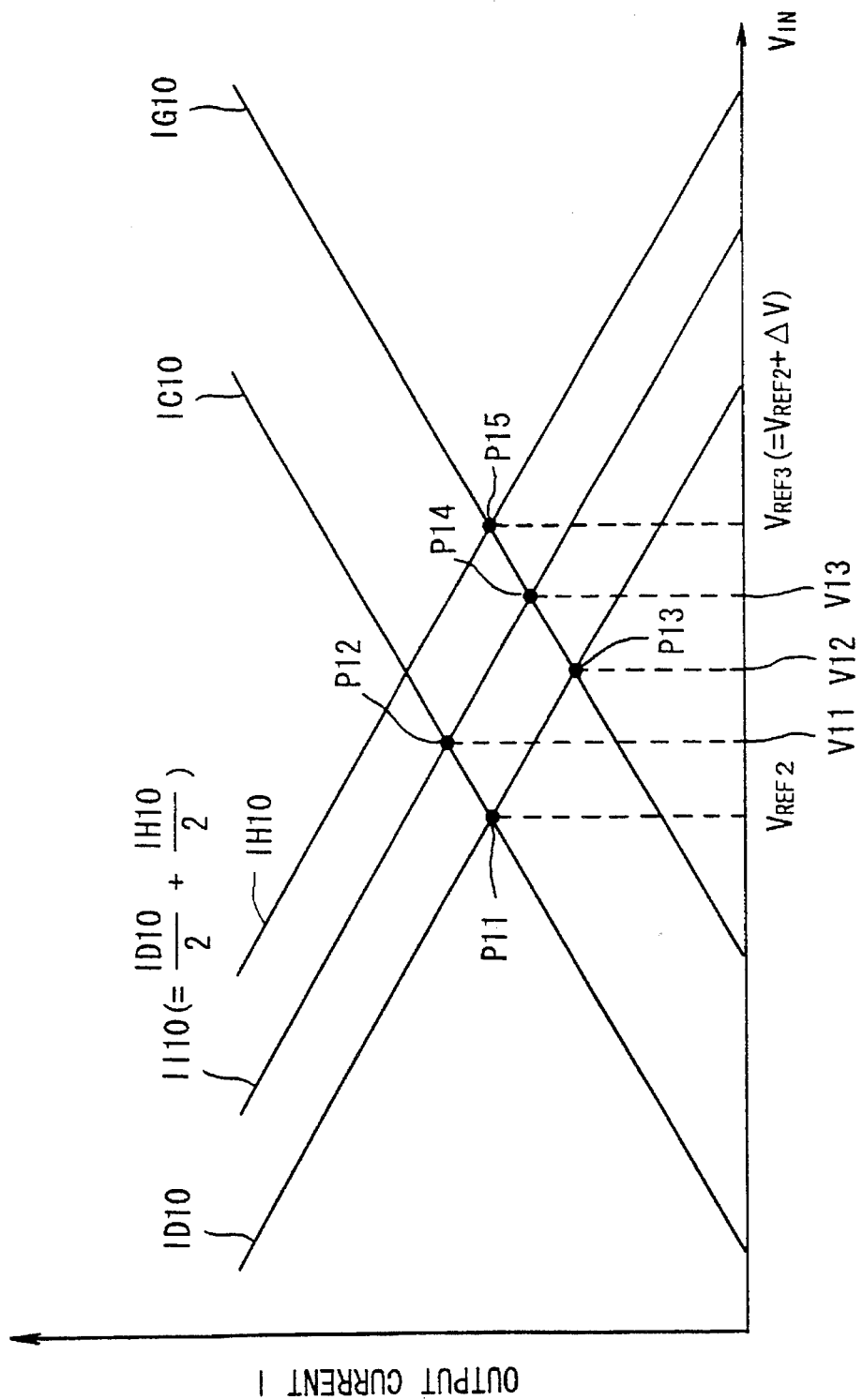
FIG. 13 is a characteristic curve diagram of the comparator circuit shown in FIG. 12.

On the other hand, as shown in FIG. 13, it is provided that the comparison output of the input signal $V_{IN}$ to the virtual reference potentials V11 and V13 can be found by comparing the composite collector current II10 in the inverted relationship to the input signal $V_{IN}$ with the collector currents IC10 and IG10 in the inverted relationship thereto. The reference potentials V11 and V13 divide the difference between the reference potential $V_{REF2}$ and $V_{REF3}$ adjacent to the reference potential $V_{REF1}$ and $V_{REF2}$ by four.

In the above arrangement, the interpolating operation of the four-dividing interpolation type comparator circuit will be explained upon increasing the input signal $V_{IN}$ from the reference potential VRFE1 to the adjacent reference potentials $V_{REF2}$ and $V_{REF3}$.

First, in the case where the input signal $V_{IN}$ exceeds the reference potential $V_{REF1}$ (the intersection P1 in FIG. 11), the values of the output voltage of the load resistor R73 through which the divided collector current IA10 flows and the load resistor R72N through which the divided collector current IB10 flows are inverted, and then the comparison output of the voltage values is newly inverted.

In addition, when the voltage value of input signal $V_{IN}$ gradually increases and exceeds the virtual reference potential V5 (the intersection P3 in FIG. 11), then the output voltage of the load resistor R72N through which the divided collector IB10 flows and that of the load resistor R72 through which the composite collector current IE10 (=IA10/2 +IB10/2) flows are inverted, and the comparison output of the voltage values is newly inverted.

Then, similarly, when the voltage value of the input signal $V_{IN}$ exceeds the virtual reference potentials V6 and V7, respectively, (the intersections P4 and P6 in FIG. 8), the output voltage of the load resistors R72N and R75 through which the divided collector currents IB10 and IC10 flow, respectively, is inverted, and the output voltage of the load resistors R74N and R72 through which the divided collector current ID10 and the composite collector current IE10 (=IA10/2+IC10/2) flow is inverted so that their comparison outputs are sequentially inverted.

Thus, the comparator circuit 30 for the four-dividing interpolation type can obtain the comparison outputs to two actually applied reference potentials $V_{REF1}$ and $V_{REF2}$ as well as to the virtual reference potentials V5, V6, and V7 dividing them by four.

Then, for the potential between the adjacent reference potentials $V_{REF2}$ and $V_{REF3}$, it is possible to detect by inversion of the output voltage of the load resistor R75 through which the divided collector current IC10 flows and that of the load resistor R74N through which the divided collector current ID10 flows the fact that the voltage value of the input signal $V_{IN}$ exceeds the reference potential $V_{REF2}$ (the intersection P11 in FIG. 13), and to find, by inversion the output voltage of the load resistor R58N through which the composite collector current II10 flows and that of the load resistor R58 through which the divided collector current IC10 flows, the fact that the input signal $V_{IN}$ exceeds the virtual reference potential V11 (the intersection P12 in FIG. 13).

At the same time, it is possible to sequentially find from the comparison output of the output voltage of the load resistors R74N and R77 the fact that the input signal $V_{IN}$ exceeds the virtual reference potential V12 (the intersection P13 in FIG. 13), and from the comparison output of the output voltage of the load resistors R58N and R76 the fact that input signal $V_{IN}$ exceeds the virtual reference potential V13 (the intersection P14 in FIG. 13).

Thus, it is possible to obtain the comparison outputs of the input signal $V_{IN}$ to the virtual reference potentials V5, V6, and V7, as well as V11, V12, and V13 equally dividing the actually applied reference potentials $V_{REF1}$ and $V_{REF2}$, as well as $V_{REF2}$ and $V_{REF3}$ by four, by comparing one of composite collector currents IE10 or II10 to the divided collector currents of each collector that is based on the result of the comparison between the adjacent reference potential and the input signal $V_{IN}$, and the divided collector currents IB10 and ID10, or ID10 and IH10 in the inverted relationship to this composite collector current. The composite collector currents IE10 and II10 being in a ratio of half to half (one to one) the divided collector currents in the non-inverted relationship to each other.

According to the above arrangement, it is possible to obtain the comparison outputs to the virtual reference potentials V5, V6, and V7, or V11, V12, and V13 for dividing the difference between the adjacent reference potentials $V_{REF1}$ and $V_{REF2}$, or $V_{REF2}$ and $V_{REF3}$ by four by adding in a ratio of half to half the two divided collector currents IA10 and IC10, or ID10 and IH10 in the inverted or non-inverted relationship to the input signal $V_{IN}$ of the collector currents that are flowing based on the result of the comparison between the adjacent reference potentials $V_{REF1}$ and $V_{REF2}$, or $V_{REF2}$ and $V_{REF3}$ and the input signal $V_{IN}$ to generate the composite collector current IE10 (=IA10/2+IC10/2) or II10 (= ID10/2+IH10/2), and by comparing the divided collector currents IB10 and ID10, or IC10 and IG10 in the non-inverted relationship to each composite collector current.

This enables it to provide the circuit with a larger difference voltage between the reference potentials than that actually applied to the differential pair so as to reduce the influence of the base-emitter voltage ΔVBE. In addition, the number of elements necessary for constituting one differential input stage is sufficient to be four when using transistors with a different emitter area ratio, or six when using transistors with the same emitter area so that the circuit can be attained with a significantly smaller number of transistors than those necessary for a conventional circuit (14 when using transistors with a different emitter area ratio, and 32 when using transistors with the same emitter area).

Figure 14:
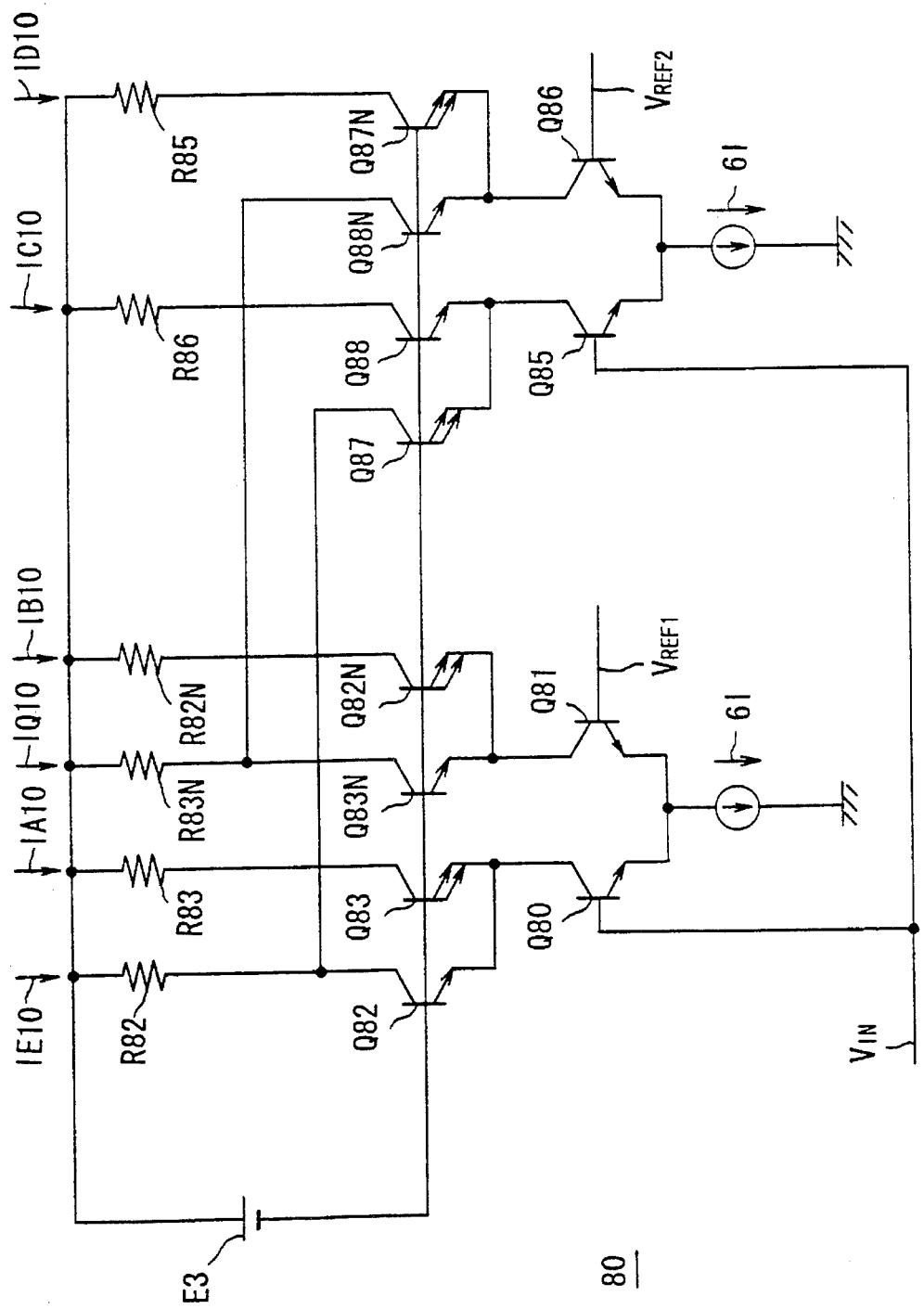
FIG. 14 is a circuit diagram of the comparator using an interpolation method in a second embodiment of the present invention.

Next, the second embodiment of the present invention is described below referring to FIG. 14.

Although the above embodiment is described for a case where the divided collector current (IC10/2) dividing in a ratio of half to half the collector current IC10 in the inverted to the input signal $V_{IN}$ of the comparison outputs of the input signal $V_{IN}$ to the reference potential $V_{REF2}$ is supplied to the differential input stage 31 for finding the comparison output to the lower reference potential $V_{REF1}$, and the divided collector current (ID10/2) for dividing in a ratio of half to half the collector current ID10 in the inverted relation to the input signal $V_{IN}$ is supplied to the differential input stage 33 for finding the comparison output to the upper reference potential $V_{REF3}$. This invention is not limited to such a case, but, as shown in FIG. 14, one set of divided collector currents (IC10/2 and ID10/2) may be composed with the divided collector current of the lower or the upper differential input stage.

In this case, because one set of composite collector currents IE10 and IQ10 is simultaneously generated, it is sufficient to find the comparison output of the input signal $V_{IN}$ to the virtual reference potentials V5, V6, and V7 by using only one of either of the composite collector currents IE10 or IQ10.

Further, although the above embodiment is described for a case where the load resistors R82, R83, R82N, . . . are directly connected to the collectors of the current dividing transistors Q82, Q83, Q83N, Q82N, this invention is not limited to such case, but base connected transistors with the same emitter area may be cascade connected between the current dividing transistors Q82, Q83, Q83N, Q82N, . . . and the load resistors R82, R83, R82N, . . . .

With such arrangement, the parasitic capacitance to the output terminal apparently becomes one which is half of the capacitance value of the parasitic capacitance to the above embodiment. Thus, the four dividing interpolation type comparator circuit 80 can be operated at a higher speed.

Furthermore, although the above embodiment is described for a case where the transistors QB0 and Q81, . . . constituting the differential pair comparing the reference potential $V_{REF1}$, . . . and the input signal $V_{IN}$ are constituted separately from the base-grounded transistors Q82, Q83, Q83N, Q82N, . . . for dividing the collector current, which is the comparison output, this invention is not limited to such a case, but it may be possible that the input signal $V_{IN}$ is supplied in parallel to the bases of Q82 and Q83 of the base grounded transistors, the reference potential $V_{REF1}$ is supplied to the bases of other transistors Q83N and Q82N, and the emitters of these four transistors are connected to a common constant current source so that the transistors for comparison also serve as those for current division.

In this case, the four-dividing interpolation type comparator circuit can be constituted with a much smaller number of elements so that the circuit area required for the comparator can be reduced.

Further, although the above embodiment is described for a case where the comparison output of the input signal $V_{IN}$ to the virtual reference potentials V5, V6, and V7 for equally dividing two adjacent reference potentials $V_{REF1}$ and $V_{REF2}$ (=$V_{REF1}$+ΔV) by four is found by interpolation, this invention is not limited to such a case, but may be applicable where a comparison output of the input signal $V_{IN}$ to a virtual reference potential equally dividing a reference potential by N (N being a natural number) is required.

In such case, dividing the difference voltage ΔV of two reference potentials by N means dividing the difference between the intermediate potential ΔV/2 and the reference potential $V_{REF1}$ or $V_{REF2}$ by N/2.

Figure 15:
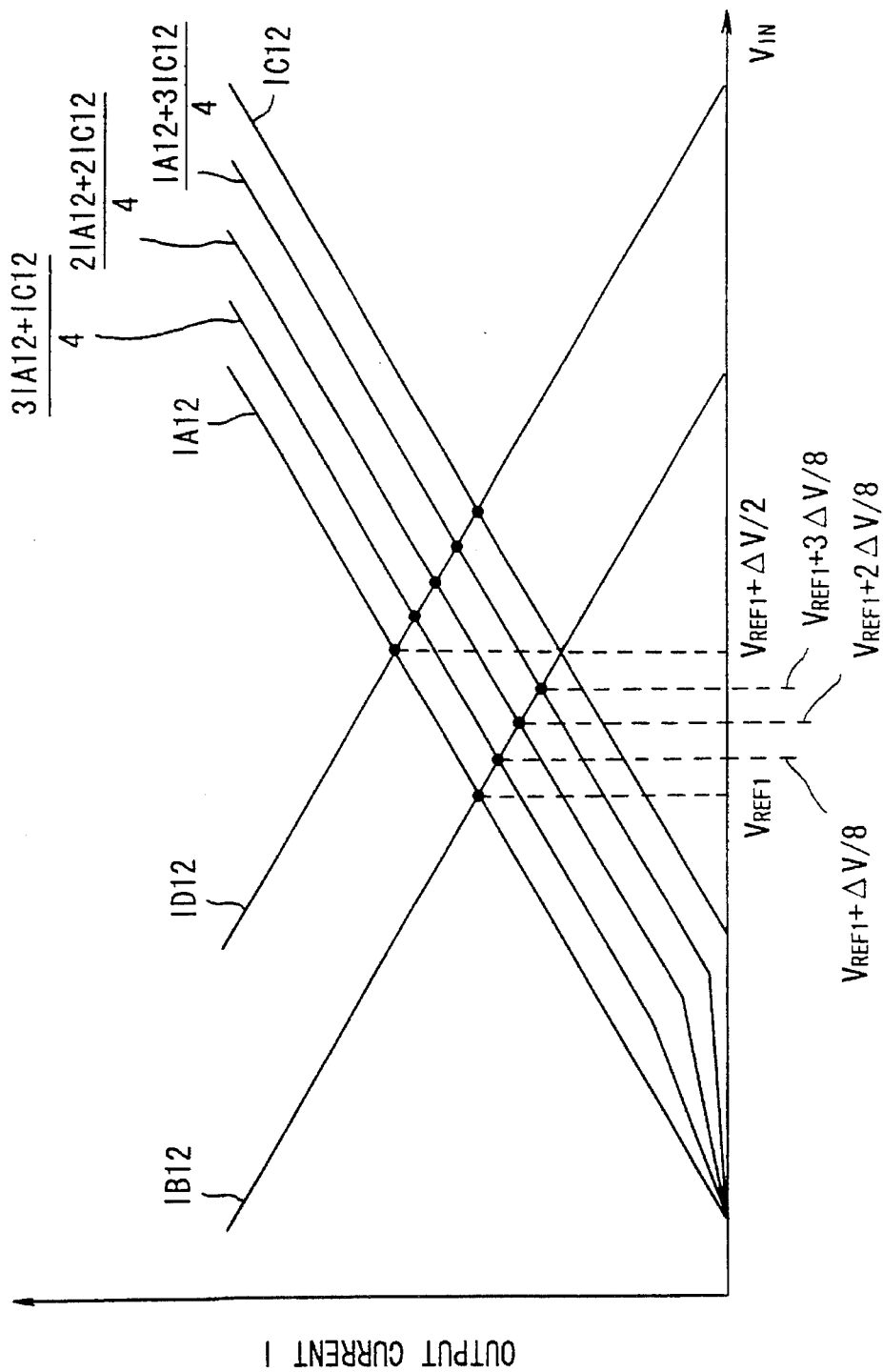
FIG. 15 is a characteristic curve diagram of the comparator circuit shown in FIG. 14.

For example, division by eight means equally dividing the difference ΔV/2 by four as shown in FIG. 15.

Therefore, it is possible to divide the difference between the reference potential $V_{REF1}$ and the intermediate potential ($V_{REF1}$ +V/2) by N/2 by generating a composite collector current internally dividing the divided collector current IA12 and the divided collector current IC12 by (N/2)–k:k (k 0, 1, . . . N/2) based on the following equation:

$$Ik12 = \frac{\left(\frac{N}{2}-k\right) \cdot IA12}{\frac{N}{2}} + \frac{k \cdot IC12}{\frac{N}{2}} \quad (1)$$

and by comparing each composite collector current with the divided collector current IB12.

Similarly, it is possible to divide the difference between the intermediate potential (V REF1+&V/2) and the reference potential $V_{REF2}$ by N/2 by generating a composite collector current internally dividing the divided collector current IA12 and the divided collector current IC12 by (N/2)–k:k (k=0, 1 . . . N/2) and by comparing each composite collector current with the divided collector current ID12.

Further, although the above embodiment is described for a case where the collector current is divided by cascade connecting a plurality of base grounded transistors with different emitter area ratios to differential pairs of transistors Q80 and Q81, 085 and Q86, . . . , this invention is not limited to such case, but emitter resistors may be added to the emitters of transistors used for current division to suppress the variation of current ratio to a low value.

Also, although the above embodiment is described for a case where the emitter area ratio of the transistors Q82 and Q83 (Q83N and Q82N) for dividing the collector current is set to 1:2, this invention is not limited to such a ratio, but another ratio may be set.

Also, although the above embodiment is described for a case where this invention is used in the comparator section of a parallel A/D convertor circuit, this invention is not limited to such a case, but may be widely applied to a comparator circuit for analog signals.

As described, according to this invention, the interpolation output stage compares either one of the composite non-inverted output current, which is sum of the first and second non-inverted comparison output currents in a predetermined ratio, or the composite inverted output current, which is sum of the first and second inverted comparison output currents in a predetermined ratio, with the comparison output currents inverted relative to the composite output current. This enables it to significantly reduce the number of transistors necessary for constituting the comparator circuit than those in the prior art so that the circuit area can be reduced for the comparator circuit which can obtain a result of comparison of the input signal to a virtual reference signal existing between the first and second reference signals.

Next, the third definite embodiment of the present invention using the principle mentioned above is described below.

Figure 16:
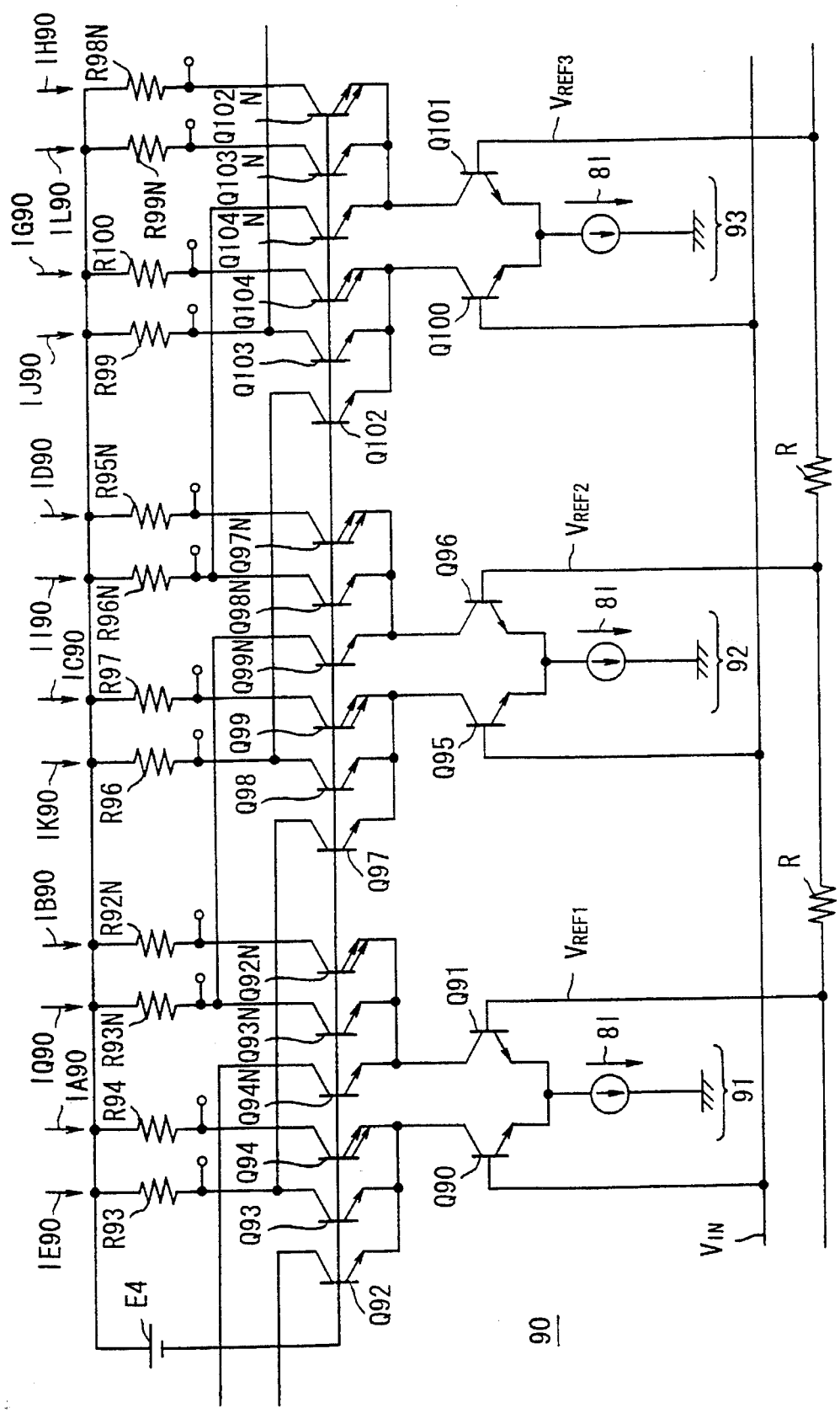
FIG. 16 is a circuit diagram of a divide-by-four type of comparator using an interpolation method in a third embodiment of the present invention.

In FIG. 16, 90 generally indicates a basic arrangement of a four-dividing interpolation type comparator circuit. It is arranged to obtain a comparison output of the input signal $V_{IN}$ to virtual reference potential, equally dividing each reference potential $V_{REF1}$, $V_{REF2}$, and $V_{REF3}$ by four by dividing the collector current, which is a comparison output of each of reference potentials $V_{REF1}$, $V_{REF2}$, and $V_{REF3}$, and the input signal $V_{IN}$, at a current ratio of 1:2, and then combining and adding them.

In the case of this embodiment, each differential input stage 91, 92, and 93 constituting the comparator has the same arrangement in which a collector current corresponding to a signal level of the input signal $V_{IN}$ to each reference potential $V_{REF1}$, $V_{REF2}$, and $V_{REF3}$ is fed by inputting the input signal $V_{IN}$ to one of transistors Q90, Q95, and Q100 constituting a differential pair, and supplying the reference potential to other transistors Q91, Q96, and Q101.

In this case, the collectors of the transistors (Q90, Q91), (Q95, Q96), and (Q100, Q101) constituting the differential pair are cascade connected with the base grounded current dividing transistors (Q92, Q93, Q94, Q94N, Q93N, Q92N), (Q97, Q98, Q99, Q99N, Q98N, Q97N), and (Q102, Q103, Q104, Q104N, Q103N, Q102N) with an emitter area ratio of 1:1:2 to divide the comparison collector current according to an emitter area ratio.

Also, each differential input stage is commonly connected with the collectors of the current dividing transistors (Q93, 97), and (Q93N, Q99N) of the adjacent differential input stages for dividing the collector current by four to obtain an output voltage composed of two sets of divided collector current mutually in an non-inverted relationship.

Thus, when assuming that the divided collector current flowing through the transistors Q94 and Q99 is IA90 and IC90, a load resistor R93 connected to the common collector of the transistors Q93 and Q97 is supplied with the composite collector current IE90 which is a combination of the divided collector currents IA90 and IC90 at the ratio of half to half (=IA90/2+ IC90/2). Similarly, when assuming that the divided collector current flowing through the transistors Q92N and Q97N is IB90 and ID90, a load resistor R93N connected to the common collector of the transistors Q93N and Q99N is supplied with the composite collector current IF90 which is a combination of the divided collector current IB90 and ID90 at the ratio of half to half (=IB90/2+ID90/2).

Thus, because each of current dividing transistors (Q93, Q94, Q93N, Q92N), (Q98, Q99, Q98N, Q97N), . . . is connected with the load resistors (R93, R94, R93N, R92N), (R96, R97, R96N, R95N), . . . with the same resistance value as each other, each load resistor is provided with an output voltage corresponding to the divided collector current value divided in accordance with the emitter area ratio of the transistors and the composite current value.

In the case of this embodiment, the comparison output to the virtual reference potential dividing the potential between the reference potential $V_{REF1}$ and $V_{REF2}$ by four can be obtained by comparing the output voltage of each load resistor.

That is, the comparison output of the input signal $V_{IN}$ to the reference potential $V_{REF1}$ and $V_{REF2}$ can be obtained, respectively, by comparing the output voltages of the load resistors R94 and R92N, and by comparing the output voltages of the load resistors R97 and R95N.

In addition, the comparison output of the input signal $V_{IN}$ to the virtual reference potential V10 (=$V_{REF1}$+$\Delta$V/2) for dividing the two reference potentials $V_{REF1}$ and $V_{REF2}$ by two can be obtained by comparing the output voltages of the load resistors R92N and R97.

It is also arranged that the comparison output of the input signal $V_{IN}$ to the virtual reference potential V11 for dividing the reference potential $V_{REF1}$ and the intermediate potential V10 by two (that is, dividing the potential between the reference potentials $V_{REF1}$ and $V_{REF2}$ by four, V11 (=$V_{REF1}$+$\Delta$V/4) can be obtained by comparing the output voltages of the load resistor R93 through which the composite collector current flows and that of the load resistor R92N through which the divided collector current flows.

Similarly, it is provided that the comparison output of the input signal $V_{IN}$ to the virtual reference potential V13 that is dividing the reference potential $V_{REF2}$ and the intermediate potential V10 by two (that is, dividing the potential between the reference potential $V_{REF1}$ and $V_{REF2}$ by four, V13 (=$V_{REF1}$∓$\Delta$V/4) can be obtained by comparing the output voltage of the load resistor R93N through which the composite collector current flows and that of the load resistor R97 through which the divided collector current flows.

In the above arrangement, the interpolating operation of the four-dividing interpolation type comparator circuit will be explained upon increasing the input signal $V_{IN}$ from the reference potential VRFE1 to the adjacent reference potential $V_{REF2}$−

First, in the case where the input signal $V_{IN}$ exceeds the reference potential $V_{REF1}$, the current difference between the divided collector current IA90 flowing through the load resistor R94 and the divided collector current IB90 flowing through the load resistor R92N gradually decreases so that the comparison output of the comparator comparing the output voltage of the load resistors R94 and R92N is inverted when the voltage value of the input signal $V_{IN}$ exceeds the reference potential $V_{REF1}$.

In addition, when the voltage value of the input signal $V_{IN}$ is gradually increased, the current difference between the divided collector current flowing through the load resistor R92N and the composite collector current (IA90/2+IC90/2) flowing through the load resistor R93 gradually decreases so that the comparison output of the comparator comparing the output voltage of the load resistors R92N and R93 is newly inverted when the voltage value of the input signal $V_{IN}$ exceeds the virtual reference potential V11 dividing the reference potentials $V_{REF1}$ and $V_{REF2}$ by four.

In the case where the voltage value of the input signal V$_{IN}$ is further increased, the current values of the divided collector currents IB90 and IC90 are inverted when the current value of the input signal $V_{IN}$ exceeds the virtual potential V12. Thus, the comparison output of the comparator comparing the output voltage of the load resistors R92N and R97 is inverted.

Similarly, in the case where the voltage value of the input signal $V_{IN}$ exceeds the virtual reference potential V13, the current values of the divided collector current IC90 and the composite collector current (IB90/2+ID90/2) are inverted so that the comparison output of the comparator comparing the output voltage of the load resistors R93N and R97 is inverted. Then, in the case where the voltage value of the input signal $V_{IN}$ exceeds the virtual reference potential $V_{REF2}$, the divided collector currents IC90 and ID90 are inverted so that the comparison output of the comparator comparing the output voltages of the load resistors R97 and R95N are inverted.

Thus, it is possible to obtain the comparison output of the input signal $V_{IN}$ to the virtual reference potentials V11, V12, and V13 which equally divide the reference potential $V_{REF1}$ and $V_{REF2}$ applied to the differential input stages 91 and 92, respectively, by comparing the input signal $V_{IN}$ with the adjacent reference potentials $V_{REF1}$ and $V_{REF2}$, respectively, comparing the output voltage provided by those of the divided collector currents IA90, IB90, and IC90, ID90 which are in an non-inverted relationship, and comparing the output voltage provided by the composite collector current which is composed by the divided corrector currents IA90, IC90, and IB90, ID90 at a ratio of half to half.

According to the above arrangement, it is possible to obtain a comparison output of the input signal $V_{IN}$ to the virtual reference potentials V11, V12, and V13 for equally dividing the actually applied reference potentials $V_{REF1}$ and $V_{REF2}$ by four by comparing the output voltage generated from the composite collector current (IA90/2+IC90/2) and (IB90/2+ID90/2), which are sum of mutually non-inverted divided collector currents IA90, IC90, and IB90, ID90 of the comparison outputs of the reference potentials $V_{REF1}$ and $V_{REF2}$, and the output voltages generated from the divided collector currents IB90 and IC90 in an opposite relationship to this composite collector current.

Also in this case, the number of elements necessary to constitute the four-dividing interpolation type comparator circuit, when looking at a single differential input stage, is six if transistors with emitters area of different ratio are used, and eight if transistors with the same emitter ratio are used. Thus, the comparator circuit can be attained with the number of elements less than that required for a conventional circuit (14 if using transistors with emitter area of different ratio, and 32 if using transistors with the same emitter area). The required circuit area of the comparator can be reduced by about ¾.

Next, the fourth embodiment of the present invention is described below.

Figure 17:
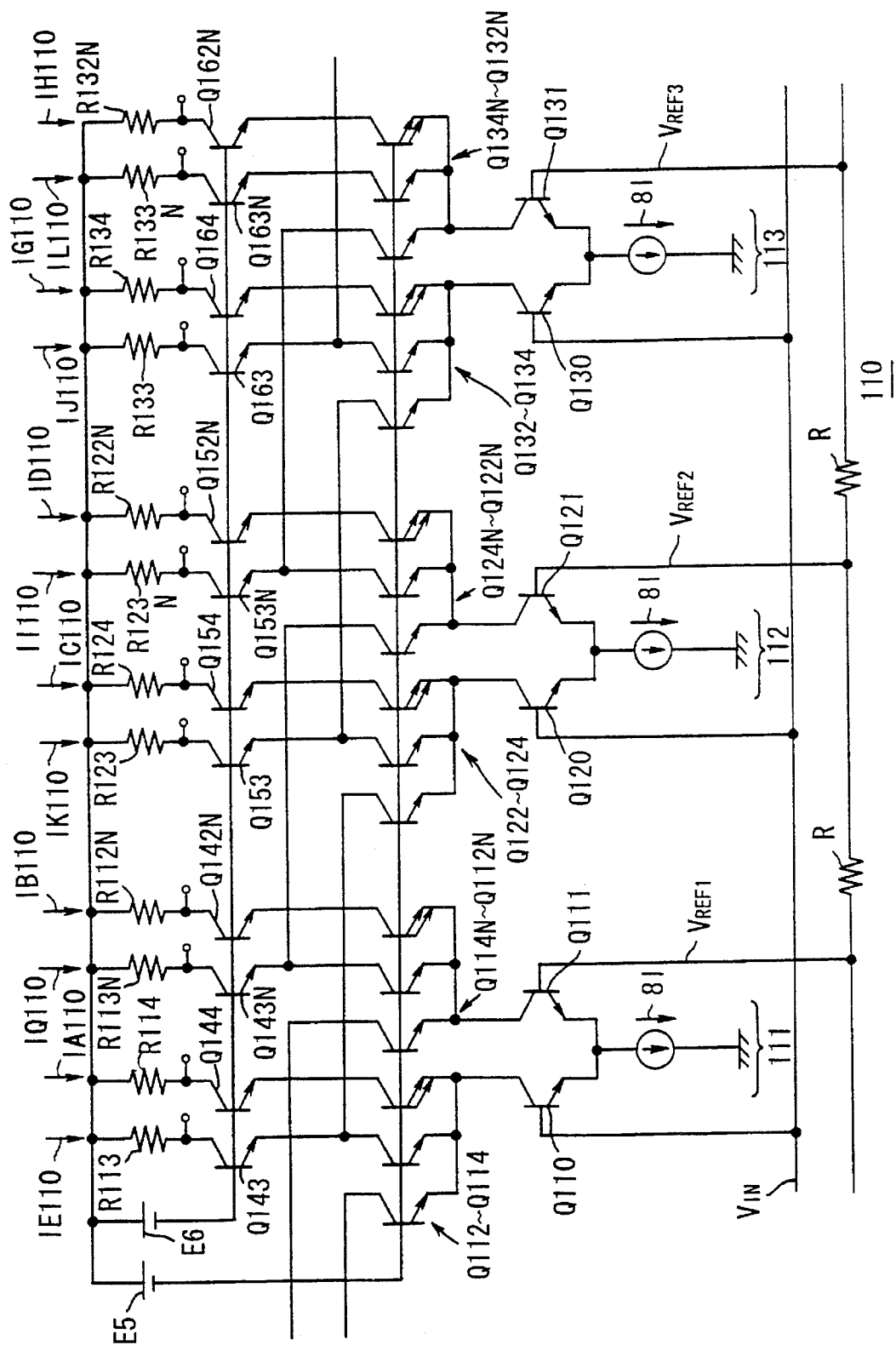
FIG. 17 is a circuit diagram of a divide-by-four type of comparator using an interpolation method in a fourth embodiment of the present invention.

In FIG. 17, the four-dividing interpolation type comparator circuit has the same arrangement, except for that base-connected transistors Q143, Q144, and Q143N, Q142N ((Q153, Q154, and Q153N, Q152N), (Q163, Q164, Q163N, Q162N)) are cascade connected between the current dividing transistors Q113, Q114, and Q113N, Q112N ((transistors Q123, Q124, and Q123N, Q122N), (Q133, Q134, Q133N, Q132N)) and the road resistors R113, R114, and R113N, R112N ((R123, R124, and R123N, R122N), (R133, R134, R133N, R132N)).

In the case of this embodiment, these four transistors Q143, Q144, and Q143N, Q142N (Q153, Q154, Q153N, Q152N, and Q163, Q164, Q163N, Q162N) cascade connected to the current dividing transistors are arranged so as to apparently make load capacitance parasitic to the output terminal of the collector capacitance (that is, one collector) of each of the transistors Q143, Q144, and Q143N, Q142N (Q153, Q154, Q153N, Q152N, and Q163, Q164, Q163N, Q162N) so as to make the time constant T of the four-dividing interpolation type comparator circuit smaller.

This is one half of the capacitance value parasitic to the first embodiment. This enables the four-dividing interpolation type comparator circuit to operate at a higher speed.

In the above arrangement, it is possible to obtain the comparison output to the virtual reference potentials V11, V12, and V13 equally dividing the actually applied reference potentials $V_{REF1}$ and $V_{REF2}$ by four, respectively, by the interpolation of the divided current of the collector current and their combination, and to easily attain the four-dividing interpolation type comparator circuit so that it can be operated at a higher speed.

Next, the fifth embodiment of the present invention is described below.

Figure 18:
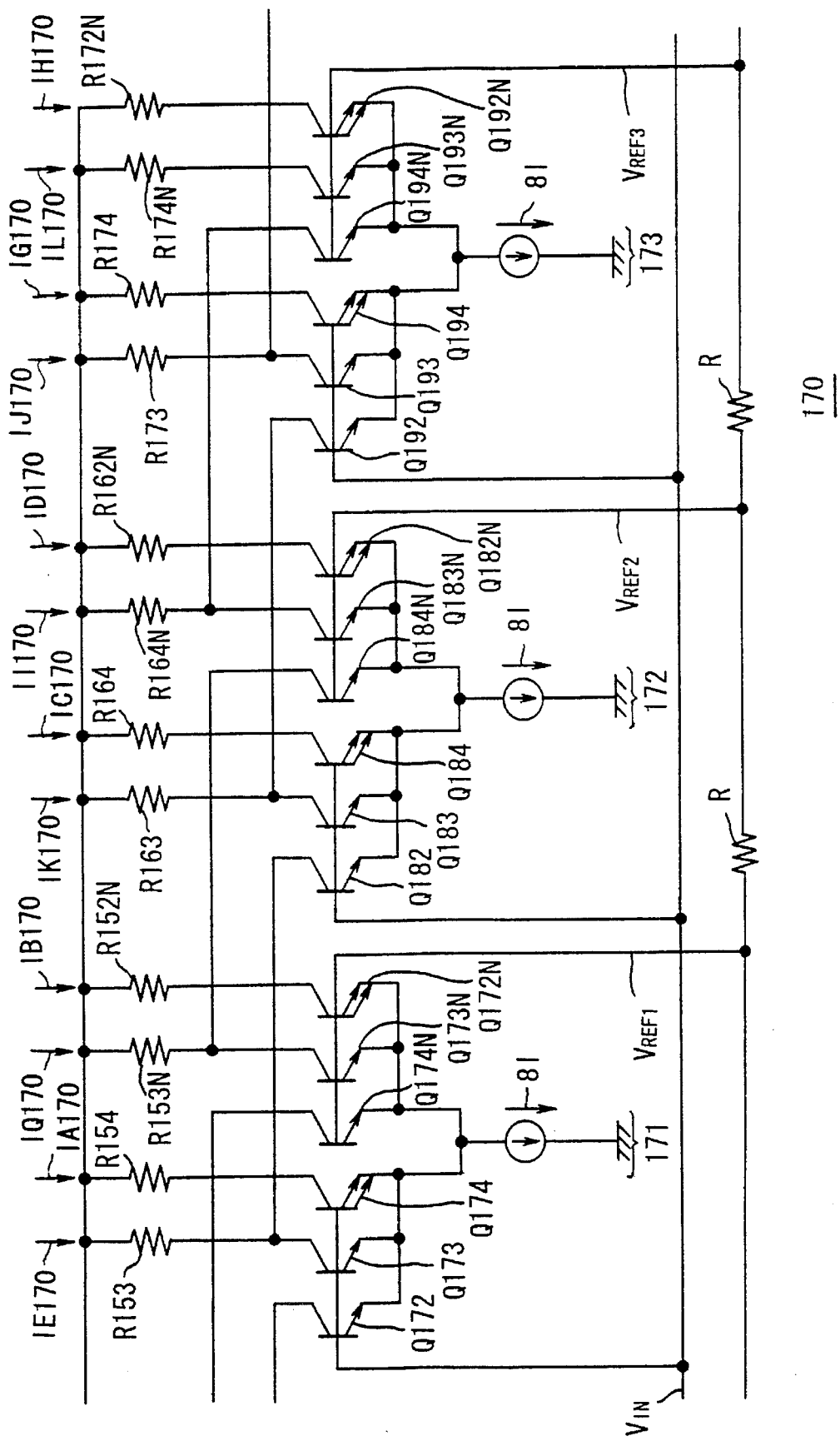
FIG. 18 is a circuit diagram of a divide-by-four type of comparator using an interpolation method in a fifth embodiment of the present invention.

In FIG. 18, 170 generally indicates the four dividing interpolation type comparator circuit which has the same arrangement with FIG. 17 except for that the transistors Q110 and Q111 constituting the differential input stage 111 and the collector current dividing transistors Q112, Q113, Q114, Q114N, Q113N, and Q112N (in FIG. 17) are shared by the transistors Q173, Q174, Q175, and Q175N, Q174N, Q173N with the emitter area ratio of 1:1:2 (in FIG. 18).

In the case of this embodiment, the differential input stages 172 and 173 have the same arrangement with FIG. 17, similar to the differential input stage 171, except that the transistors Q120 and Q121, as well as Q130 and Q131 and the collector current dividing transistors Q122, Q123, Q124, Q124N, Q123N, Q122N, and Q132, Q133, Q134, Q134N, Q133N, Q132N connected to their collectors are shared by transistors Q182, Q183, Q184, Q184N, Q183N, Q182N, and Q192, Q193, Q194, Q194N, Q193N, Q192N with the emitter area ratio of 1:1:2.

Furthermore, the input signal $V_{IN}$ is commonly inputted to the base of each of the transistors Q172 to Q174, Q182 to Q184, and Q192 to Q194, while the reference potentials $V_{REF1}$, $V_{REF2}$, and $V_{REF3}$ are inputted into the base of each of the transistors Q172N to Q174N, Q182N to Q184N, and Q192N to Q194N, respectively.

Therefore, the collector current, the reference potential of which is the reference potential $V_{REF1}$, and which is in an non-inverted and inverted relationship to the input signal $V_{IN}$, flows through the load resistors R154 and R152N so that a result of the comparison of the input signal $V_{IN}$ to the reference potential can be obtained from the output voltage generated at the load resistors R154 and R152N.

Similarly, the collector current, the reference potential of which is the reference potential $V_{REF2}$, and which is in a non-inverted and inverted relationship to the input signal $V_{IN}$, flows through the load resistors R164 and R162N so that a result of the comparison of the input signal $V_{IN}$ to the reference potential can be obtained.

Furthermore, similar to the above-mentioned embodiment, the collector current obtained by composing the collector current in a mutually non-inverted relationship and a mutually inverted relationship with the input signal to the reference potential $V_{REF1}$ and $V_{REF2}$ at a ratio of half to half, respectively flows through the load resistors R153 and R153N.

Therefore, a result of comparison of the input signal $V_{IN}$ to the virtual reference potential $V_{IN}$ can be obtained by comparing the output voltage generated at the load resistor R152N and the output voltage generated at the load resistor R153. Similarly, a result of comparison of the input signal $V_{IN}$ to the virtual reference potential V13 can be obtained by comparing the output voltage generated at the load register R153N and the output voltage generated at the load register R164.

Similarly, a result of comparison of the input voltage $V_{IN}$ to the virtual reference potential V12 can be obtained by comparing the output voltage generated at the load register R152N and the output voltage generated at the load resistor R164.

According to the above arrangement, the four dividing interpolation type comparator circuit can be attained with further smaller number of elements so that the circuit area required for the comparator can be reduced.

Next, the sixth embodiment of the present invention is described below.

Although the above embodiment is described for a case where the comparison output of the input signal $V_{IN}$ to the virtual reference potentials V11, V12, and V13 equally dividing two adjacent reference potentials $V_{REF1}$ and $V_{REF2}$ (=$V_{REF1}$+ΔV) by four is found by interpolation, this invention is not limited to such a case, but may be widely applicable to such a case where to a comparison output of the input signal $V_{IN}$ virtual reference potential equally dividing a reference potential by N (N being a natural number).

In such case, dividing the difference voltage $\Delta V$ of two reference potential by N means dividing the difference between the intermediate potential $\Delta V/2$ and the reference potential $V_{REF1}$ or $V_{REF2}$ by N/2.

Figure 19:
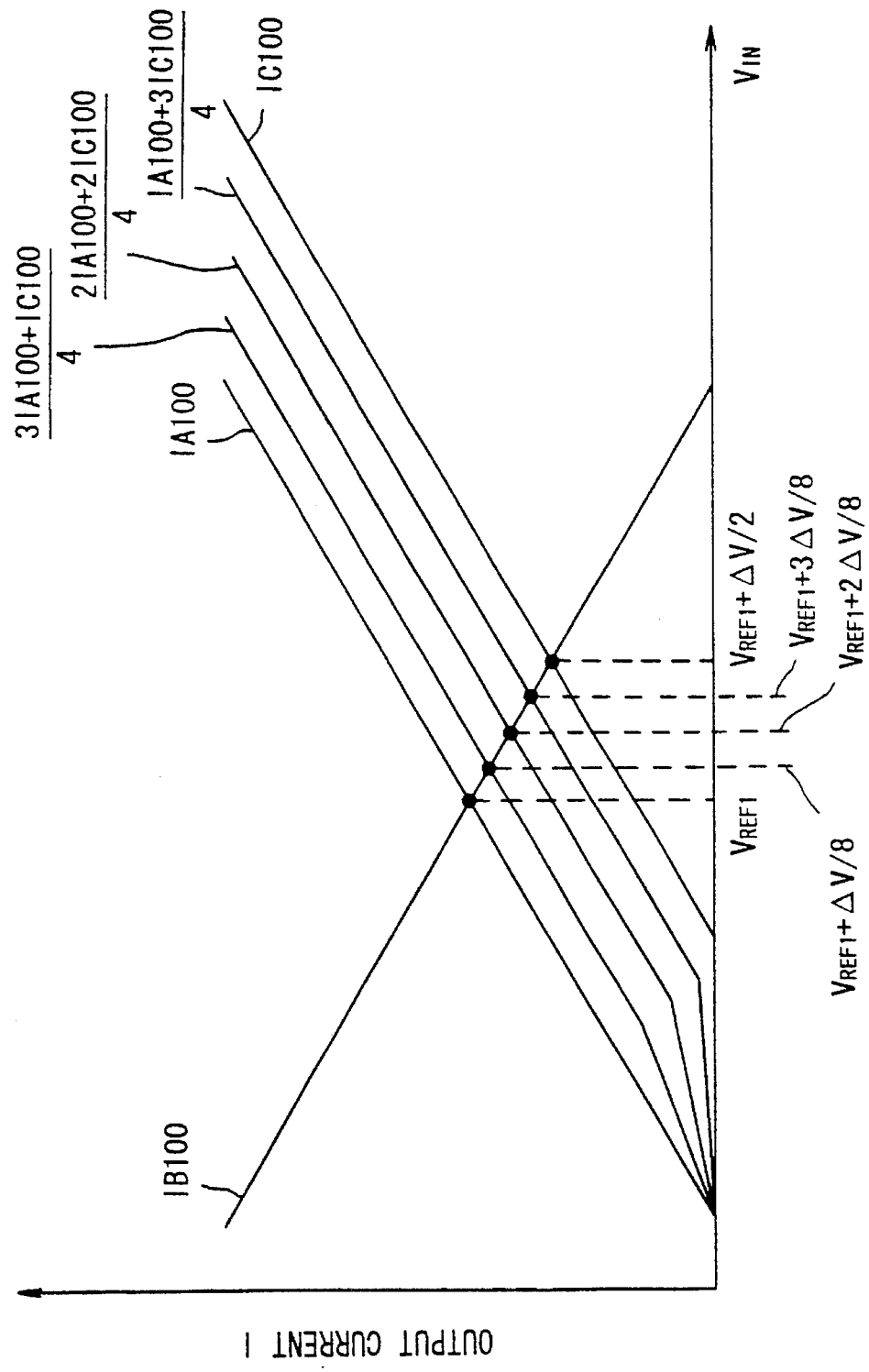
FIG. 19 is a characteristic curve diagram of an divide-by-eight type of comparator circuit for explaining a sixth embodiment of the present invention.

For example, as shown in FIG. 19, division by eight means equally dividing the difference $\Delta V/2$ by four.

Therefore, it is possible to divide the difference between the reference potential $V_{REF1}$ and the intermediate potential ($V_{REF1}$ +V/2) by N/2 by generating a composite collector current internally dividing the divided collector current IA100 and the divided collector current IC100 by (N/2)–k:k (k=0, 1, . . . N/2) based on the following equation:

$$Ik = \frac{\left(\frac{N}{2} - k\right) \cdot IA100}{\frac{N}{2}} + \frac{k \cdot IC100}{\frac{N}{2}} \quad (2)$$

and by comparing each composite collector current with the divided collector current IB100.

Similarly, it is possible to divide the difference between the intermediate potential ($V_{REF1}+\Delta V/2$) and the reference potential $V_{REF2}$ by N/2 by generating a composite collector current internally dividing the divided collector current IB100 and the divided collector current IB100 by (N/2)–k:k (k=0, 1 . . . N/2) and by comparing each composite collector current with the divided collector current IC100.

Although the above embodiment (in FIG. 17) is described for a case where the collector current is divided by cascade connecting a plurality of base grounded transistors with different emitter area ratios to differential pairs of transistors Q110 and Q111, Q120 and Q121, . . . , this invention is not limited to such case, but emitter resistors may be added to the emitters of transistors used for current division to suppress the variation of current ratio to a low value.

Also, although the above embodiment (in FIG. 17) is described for a case where the emitter area ratio of the transistors Q112, Q113, and Q114 (Q114N, Q113N, and Q112N) for dividing the collector current is set to 1:1:2, this invention is not limited to such a ratio, but another ratio may be set.

Also, although the above embodiment is described for a case where this invention is used in the comparator section of a parallel A/D convertor circuit, this invention is not limited to such a case, but may be widely applied to a comparator circuit for analog signals.

As described in the above, according to this invention, the first and second composite output currents are generated by adding non-inverted comparison output current of the first and second comparison output currents of an input signal to the first and second reference signals, and the generated first and second composite output currents are compared with an comparison output current in inverted relative to these composite output signals. This enables a comparator circuit to obtain as a result of a comparison of the input signal to a virtual reference signal existing between the first and second reference signals. In this case, the number of transistors required for constituting the comparator circuit is significantly reduced from those of the prior art so that the area of the comparator circuit can be further decreased.

Next, the seventh embodiment of the present invention is described below.

Figure 20:
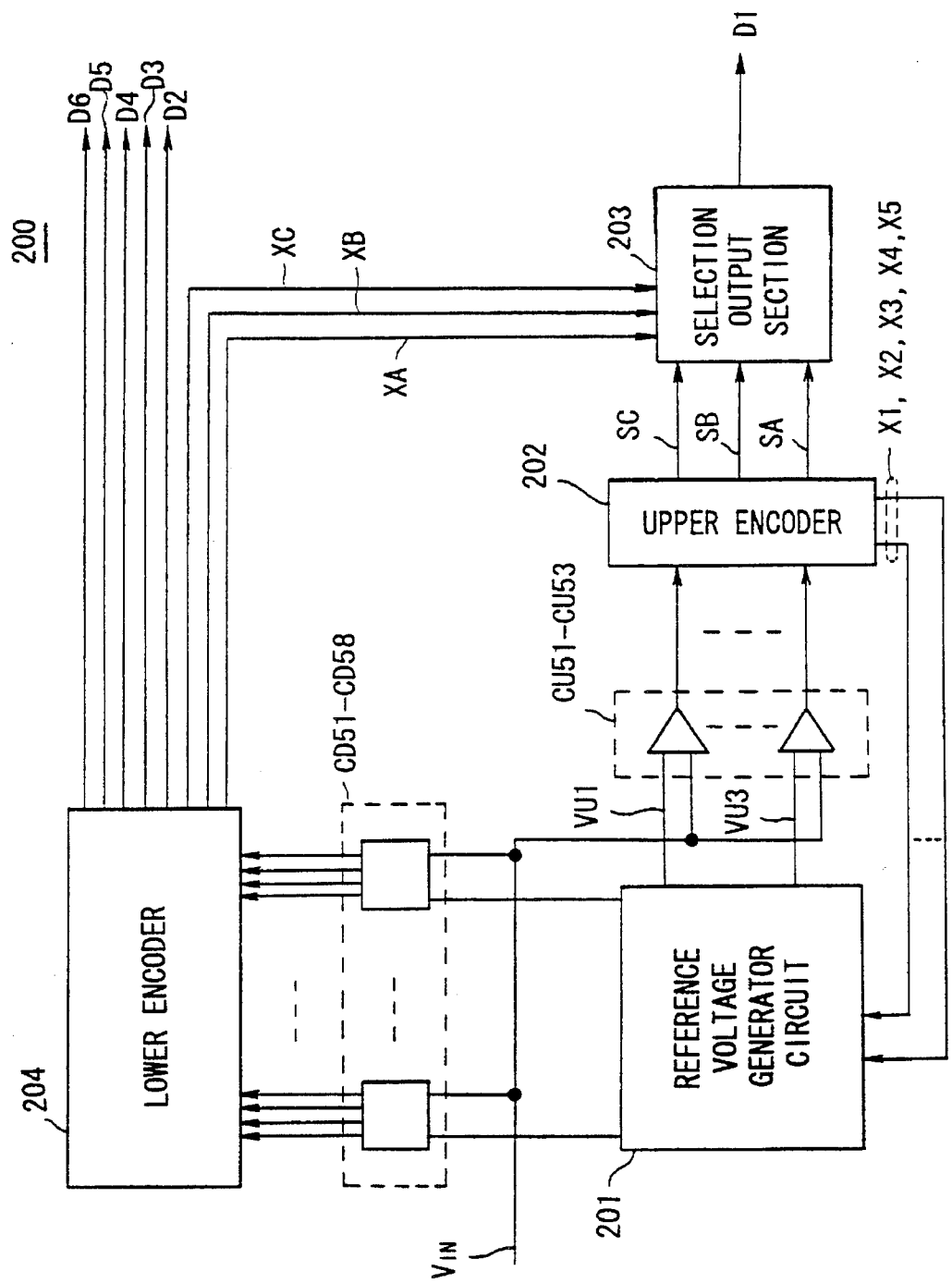
FIGS. 20 and 21 are diagrams showing the constitution of the series/parallel A/D convertor which is suitable for the interpolation type of comparator of the present invention.

In FIG. 20, 200 generally indicates a two-step parallel type serial/parallel A/D convertor circuit. It is arranged that the number of differential pairs constituting the first circuit of the lower comparator is reduced by using current interpolating lower comparators CD51 to CD58 as the lower comparator to constitute an A/D convertor circuit with resolution of six bits without decreasing voltage necessary for the least significant bit (1 LSB).

Figure 21:
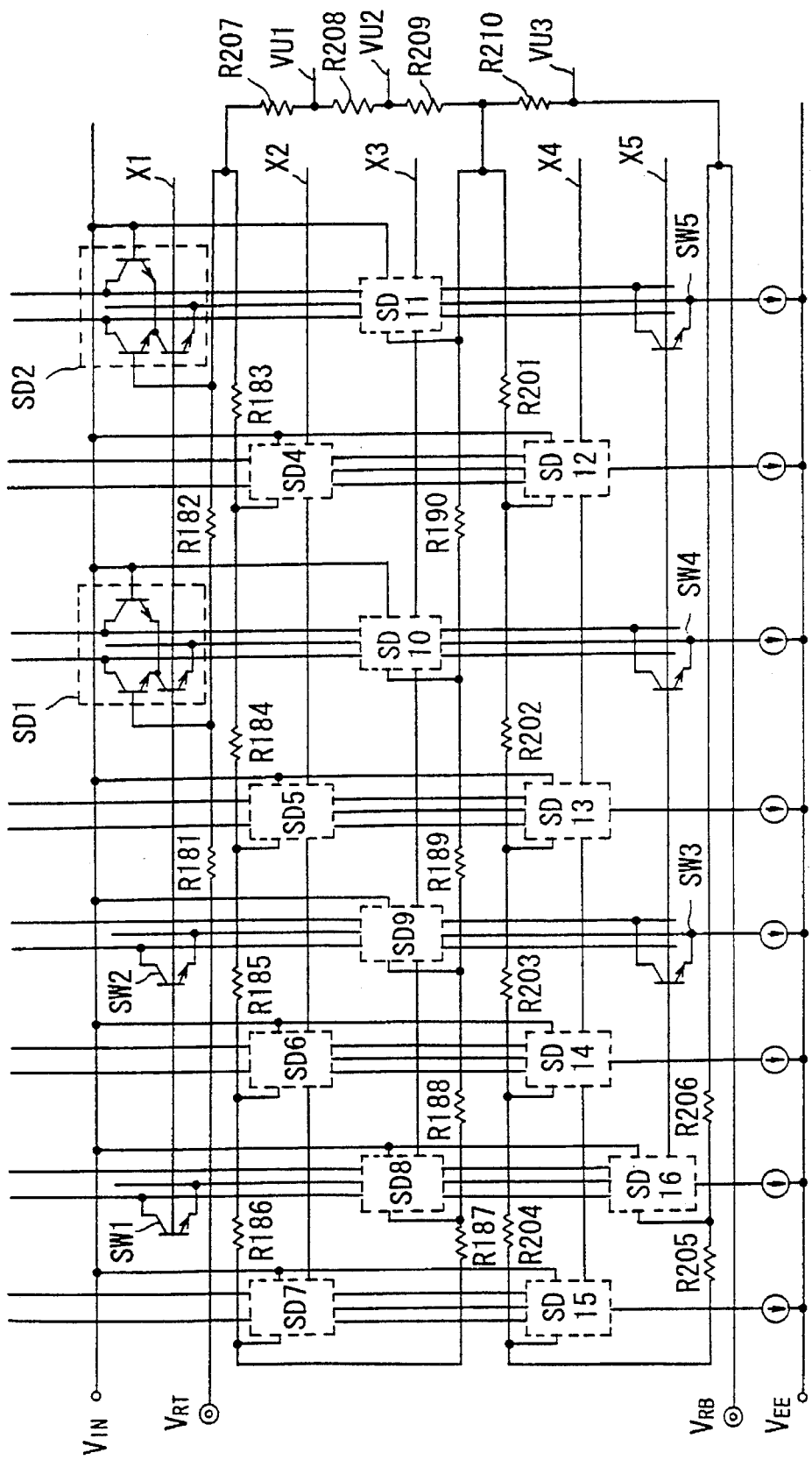

In this case, the A/D convertor circuit 200 is arranged to compare in the upper comparators CU51 to CU53 reference voltage VU1, VU2 and VU3, which divide the reference voltage $V_{RT}$ and $V_{RB}$ generated by a reference voltage generator circuit 201 by four reference potential intervals ($V_{RB}$ to VU1, VU1 to VU2, VU2 to VU3, and VU3 to $V_{RT}$), and the input signal $V_{IN}$, and to supply the result of comparison to the upper encoder 202 (FIG. 21).

In this embodiment the upper encoder 202 outputs a code value, which may be selected by a redundancy correction feature as the most significant bit D1, to a selection output section 203 as three sets of line signals SA, SB, and SC, and outputs lower reference potential selection signals X1 to X5, which makes switches SW1 to SW4 and SD1 to SD16 operate, to the reference voltage generator circuit 201 so as to switch the reference potential supplied to the lower comparators CD51 to CD58.

Figure 22:
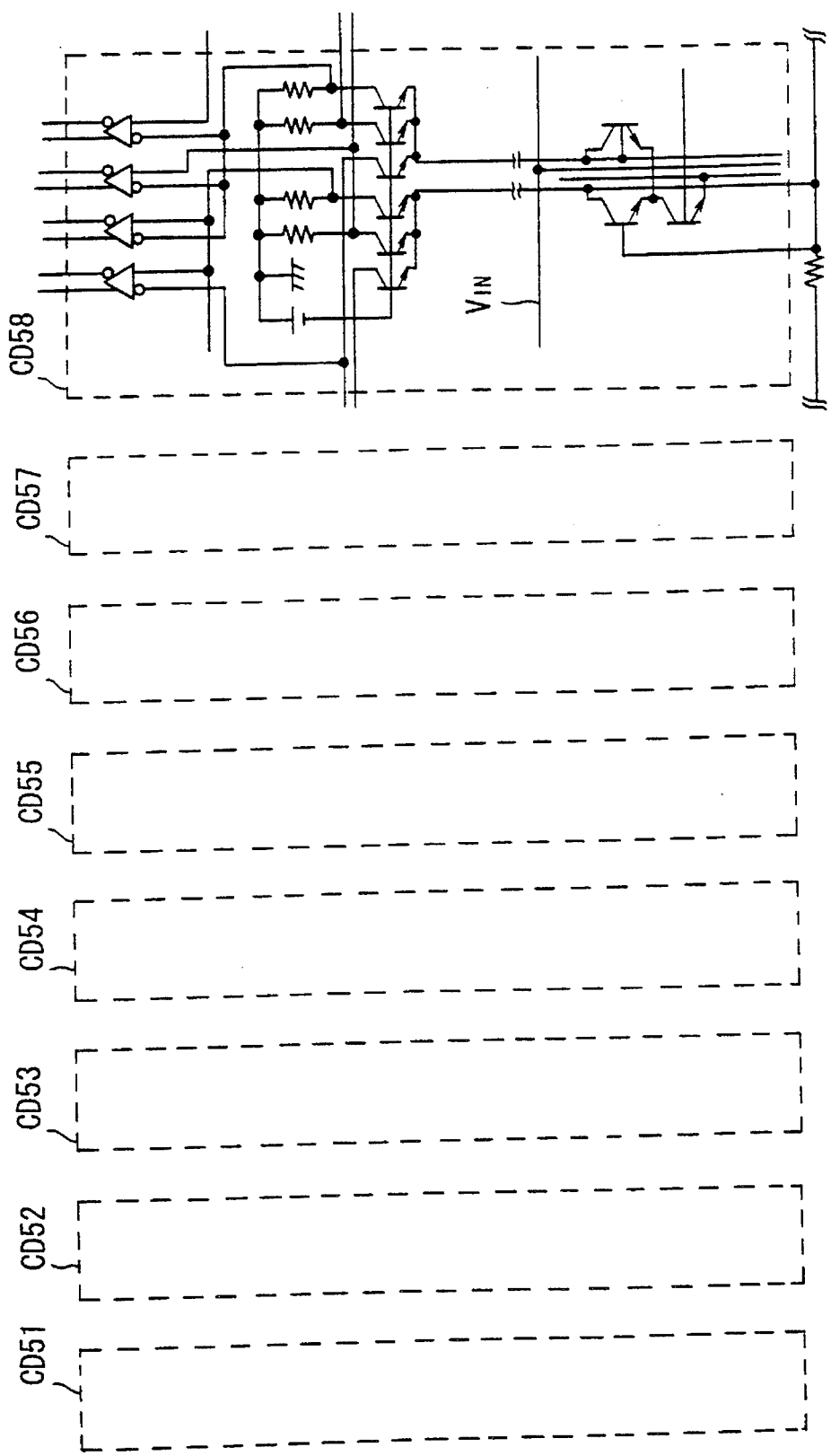
FIGS. 22 and 23 are diagrams showing the constitution of a block, in which the interpolation type of comparator in a seventh embodiment of the present invention is used for the lower comparator of the series/parallel A/D convertor, and a circuit diagram showing the constitution of its block.

In this case, the lower comparators CD51 to CD58 (FIG. 22) input the reference potential interval detected as one to which the input signal $V_{IN}$ belongs in coding the upper bits, and reference potential equally dividing the interval for interpolating the redundancy by eight through the switches SW1 to SW4, or switching blocks SD1 to SD16 which serve as both the differential pairs in the first stage of the lower comparator and switches.

In this case, when the lower comparators CD51 to CD58 compare each reference potential and the input signal $V_{IN}$ by using the differential pair of the first stage, the collector current is divided by a plurality of divided collector currents with different current ratio by using a plurality of base-grounded transistors cascade connected to the differential pair, and compares the output voltage generated by combination of the divided collector current.

Also, the lower comparators CD51 to CD58 are arranged to output to the lower encoder 54 four comparison outputs, which correspond to the comparison outputs of the input signal $V_{IN}$ to the virtual reference potential dividing the difference between adjacent reference potential by four.

The lower encoder 204 codes and outputs the lower five bits D2 to D6 based on these 32 (=4×8) sets of comparison outputs inputted from each lower comparator CD51 to CD58.

Also, the lower encoder 204 generates selection signals XA, XB, and XC which correct the code value of the most significant bit D1 by the redundancy correction feature, outputs it to the selection output section 203, and outputs one of the line signals SA, SB, and SC as the most significant bit D1.

This enables the A/D convertor circuit 200 to operate as an A/D convertor circuit with resolution of six bits with small linearity error.

The circuit diagram using the interpolation principle described above is shown regarding the lower comparators CD51 to CD58.

Figure 23:
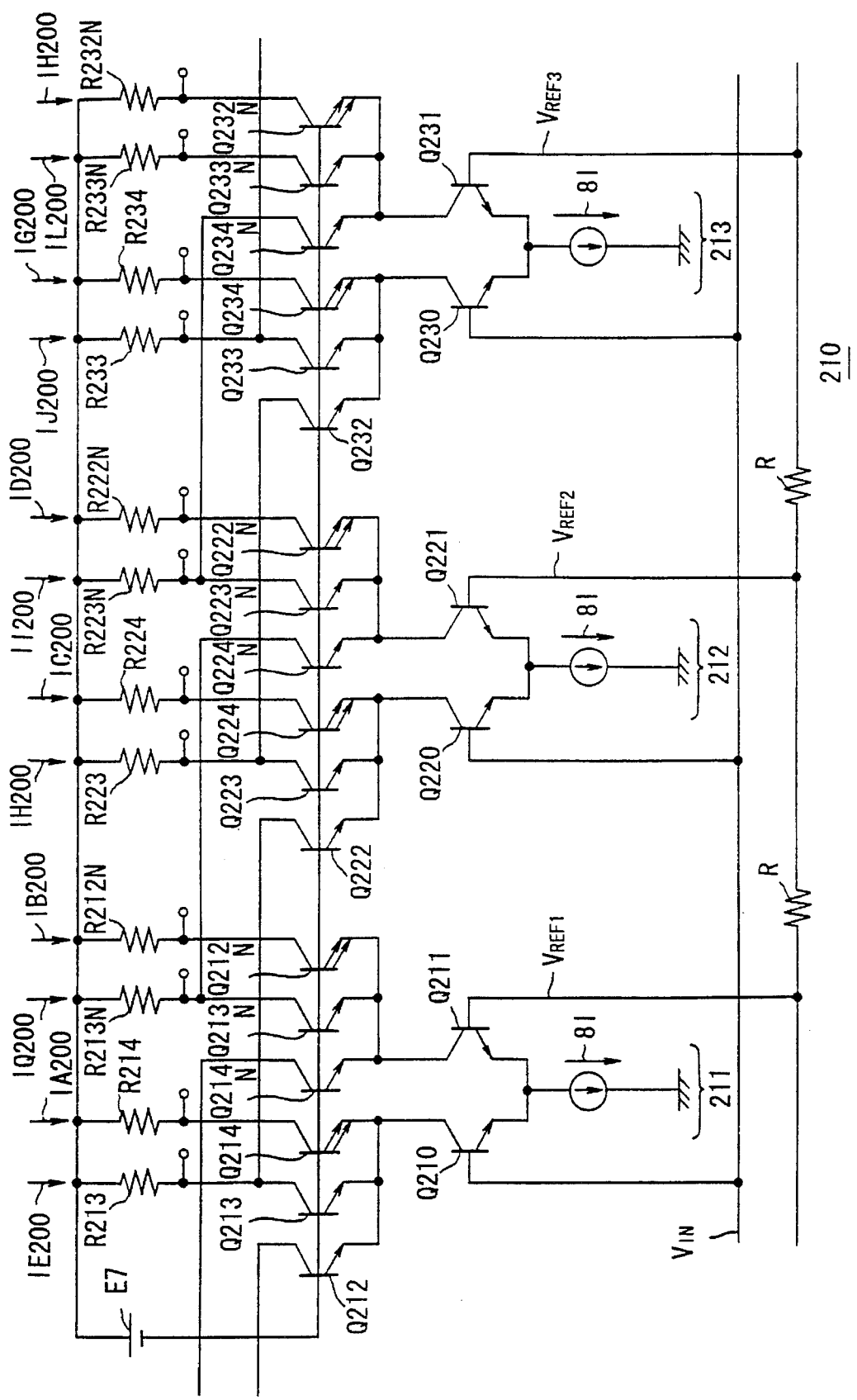

In FIG. 23, 210 generally indicates a lower comparator section. It is arranged to obtain a comparison output of the input signal $V_{IN}$ to virtual reference potential, equally dividing reference potentials $V_{REF1}$ and $V_{REF2}$, $V_{REF2}$ and $V_{REF3}$ by four by dividing the collector current, which is a comparison output of each of three adjacent reference potentials $V_{REF1}$, $V_{REF2}$, and $V_{REF3}$, and the input signal $V_{IN}$, at a current ratio of 1:2, and then combining and adding them.

This is generally same construction with one described above, but the construction for using a serial/parallel A/D convertor is described below.

In the case of this embodiment, each differential input stage 211, 212, and 213 constituting the first stage circuit of the lower comparator has the same arrangement each other in which a collector current corresponding to a signal level of the input signal $V_{IN}$ to respective reference potentials $V_{REF1}$, $V_{REF2}$, and $V_{REF3}$ is fed by inputting the input signal $V_{IN}$ to one of transistors Q210, Q220, and Q230 constituting a differential pair, and supplying the reference potential to other transistors Q211, Q221, and Q222.

In this case, the collectors of transistors (Q210, Q211), (Q220, Q221), and (Q230, Q231) constituting the differential pair are cascade connected with base-grounded current dividing transistors (Q212, Q213, Q214N, Q213N, Q212N), (Q222, Q223, Q224, Q224N, Q223N, Q222N), and (Q232, Q233, Q234, Q234N, Q233N, Q232N) with an emitter area ratio of 1:1:2 to divide the comparison collector current according to an emitter area ratio.

Also, each differential input stage is commonly connected with the collectors of the current dividing transistors (Q213, Q222), and (Q213N, Q224N) of the adjacent differential input stages dividing the collector current by four to obtain an output voltage by composing two sets of divided collector current mutually in a non-inverted relationship.

Thus, when assuming that the divided collector current flowing through the transistors Q214 and Q224 is IA200 and IC200, a load resistor R213 connected to the common collector of the transistors Q213 and Q222 is supplied with the composite collector current IE200 which is combination of the divided collector current IA200 and IC200 at the ratio of half to half (=IA200/2+IC200/2).

Similarly, when assuming that the divided collector current flowing through the transistors Q212N and Q222N is IB200 and ID200, a load resistor R213N connected to the common collector of the transistors Q213N and Q224N is supplied with the composite collector current IQ200 which is combination of the divided collector current IB200 and ID200 at the ratio of half to half (= IB200/2+ID200/2).

Thus, because each of current dividing transistors (Q213, Q214, Q213N, Q212N), (Q223, Q224, Q223N, Q222N), . . . is connected with the load resistors (R213, R214, R213N, R212N), (R223, R224, R223N, R222N), . . . with the same resistance value, each load resistor is provided with an output voltage corresponding to the divided collector current value divided in accordance with the emitter area ratio of the transistors and the composite current value.

In the case of this embodiment, the comparison output to the virtual reference potential dividing the potential between the reference potentials $V_{REF1}$ and $V_{REF2}$ by four can be obtained by comparing the output voltage of each load resistor.

That is, the comparison output of the input signal $V_{IN}$ to the reference potentials $V_{REF1}$ and $V_{REF2}$ can be obtained, respectively, by comparing the output voltage of the load resistors R214 and R212N, and by comparing the output voltage of the load resistors R224 and R222N.

In addition, the comparison output of the input signal $V_{IN}$ to the virtual reference potential V22 signal $V_{22}$ (=$V_{REF1}$+$\Delta V/2$) dividing two reference potentials $V_{REF1}$ and $V_{REF2}$ by two can be obtained by comparing the output voltage of the load resistors R212N and R224.

It is also arranged that the comparison output of the input signal $V_{IN}$ to the virtual reference potential V21 dividing the reference potential $V_{REF1}$ and the intermediate potential V22 by two (that is, dividing the potentials $V_{REF1}$ and $V_{REF2}$ by four, V21=$V_{REF1}$ +$\Delta V/4$) can be obtained by comparing the output voltage of the load resistor R213 through which the composite collector current flows and that of the load resistor R212N through which the divided collector current flows.

Similarly, it is arranged that the comparison output of the input signal $V_{IN}$ to the virtual reference potential V23 dividing the reference potential $V_{REF2}$ and the intermediate potential V22 by two (that is, dividing the potential between the reference potentials $V_{REF1}$ and $V_{REF2}$ by four, V23= $V_{REF1}$ $\mp$ $\Delta V/4$) can be obtained by comparing the output voltage of the load resistor R213N through which the composite collector current flows and that of the load resistor R224 through which the divided collector current flows.

In the above arrangement, the A/D convertor circuit 200 inputs the input signal $V_{IN}$ to the upper comparators CU51 to CU53 for comparison with the reference voltages VU1 to VU3, and supplies the line signals SA to SC corresponding to the comparison outputs to the selection output section 203. Then, the reference potential dividing the reference potential interval to which the input signal $V_{IN}$ by eight and its redundancy correction interval are switched by the lower reference potential selection signals X1 to X5, and supplies to the differential pair of the first stage in the lower comparators CD51 to CD58.

Now, the operation of a four division interpolating comparator circuit will be explained when sequentially increasing the input signal $V_{IN}$ from the reference potential $V_{REF1}$ to the adjacent reference potentials $V_{REF2}$ and $V_{REF3}$ by assuming that the reference potentials $V_{REF1}$, $V_{REF2}$, and $V_{REF3}$ are applied to the differential pairs of the first stage in CD51, CD53, and CD55 of the lower comparators CD51 to CD58.

First, in the case where the input signal $V_{IN}$ exceeds the reference potential $V_{REF1}$, the current difference between the divided collector current IA200 flowing through the load resistor R214 and the divided collector current IB200 flowing through the load resistor R212N gradually decreases so that the comparison output of the comparator comparing the output voltage of the load resistors R214 and R212N is inverted when the voltage value of the input signal $V_{IN}$ exceeds the reference potential In addition, when the voltage value of the input signal $V_{IN}$ is gradually increased, the current difference between the divided collector current flowing through the load resistor R212N and the composite collector current (IA200/2+ IC200/2) flowing through the load resistor R213 gradually decreases so that the comparison output of the comparator comparing the output voltage of the load resistors R212N and R213 is newly inverted when the voltage value of the input signal $V_{IN}$ exceeds the virtual reference potential V21 dividing the reference potentials $V_{REF1}$ and $V_{REF2}$ by four.

In the case where the voltage value of the input signal $V_{IN}$ is further increased, the current values of the divided collector currents IB200 and IC200 are inverted when the current value of the input signal $V_{IN}$ exceeds the virtual potential V22. Thus, the comparison output of the comparator comparing the output voltage of the load resistors R212N and R224 is inverted.

Similarly, in the case where the voltage value of the input signal $V_{IN}$ exceeds the virtual reference potential V23, the current values of the divided collector current IC200 and the composite collector current (IB200/2+ID200/2) are inverted so that the comparison output of the comparator comparing the output voltage of the load resistors R213N and R224 is inverted. Then, in the case where the voltage value of the input signal $V_{IN}$ exceeds the virtual reference potential $V_{REF2}$, the divided collector currents IC200 and ID200 are inverted so that the comparison output of the comparator comparing the output voltages of the load resistors R224 and R222N are inverted.

As described, the lower comparator section 210 can obtain comparison outputs to two actually applied reference potentials $V_{REF1}$ and $V_{REF2}$ as well as the virtual reference potentials V21, V22, and V23 dividing them by four.

Then, for the potential between the adjacent reference potentials $V_{REF2}$ and $V_{REF3}$, it is possible to detect by inversion of the output voltage of the load resistor R224 through which the divided collector current IC200 flows and that of the load resistor R222N through which the divided collector current ID200 flows the fact that the voltage value of the input signal $V_{IN}$ exceeds the virtual reference potential $V_{REF2}$, and to find by inversion the output voltage of the load resistor R223 through which the composite collector current IH200 flows and that of the load resistor R222N through which the divided collector current ID200 flows the fact that the input signal $V_{IN}$ exceeds the virtual reference potential V31.

At the same time, it is possible to sequentially find from the comparison output of the output voltage of the load resistors R222N and R234 the fact that the input signal $V_{IN}$ exceeds the virtual reference potential V32, and from the comparison output of the output voltage of the load resistors R223N and R234 the fact that input signal $V_{IN}$ exceeds the virtual reference potential V33.

Thus, it is possible to obtain the comparison output of the input signal $V_{IN}$ to the virtual reference potentials V21, V22, and V23 which equally divide the reference potentials $V_{REF1}$ and $V_{REF2}$ applied to the differential input stages 211 and 212, respectively, by comparing the input signal $V_{IN}$ with the adjacent reference potentials $V_{REF1}$ and $V_{REF2}$, respectively, comparing output voltage provided by those of the divided collector currents IA200, IB200, and IC200, ID200 which are in an inverted relationship, and comparing the output voltage provided by the composite collector current which is composed by the divided corrector currents IA200, IC200, and IB200, ID200 at a ratio of half to half.

Similar comparison outputs can be obtained for the other lower comparators CD53, CD54 to CD58. The lower encoder 204 is inputted with four comparison outputs from eight sets of lower comparators CD51 to CD58, respectively.

Thus, the A/D convertor circuit 200 can obtain an A/D converted output with a resolution of six bits by using a reference voltage generator circuit 201 of a similar arrangement to a conventional reference voltage generator circuit.

According to the above arrangement, it is possible to obtain comparison output of the input signal $V_{IN}$ to the virtual reference potentials V21, V22, and V23 equally dividing the actually applied reference potentials $V_{REF1}$ and $V_{REF2}$ by four by comparing the output voltage generated from the composite collector current (IA200/2+ IC200/2) and (IB200/2+ID200/2), which are a sum of mutually non-inverted divided collector currents IA200, IC200, and IB200, ID200 of the comparison outputs of the reference potentials $V_{REF1}$ and $V_{REF2}$, and the output voltages generated from the divided collector currents IB200 and IC200 in an opposite relationship to this composite collector current.

Thus, the number of elements necessary to constitute the lower comparator of A/D convertor circuit 200, when looking at a single differential input stage, is six if transistors with emitters area of different ratio are used, and eight if transistors with the same emitter ratio are used. Thus, the comparator circuit can be attained with the number of elements less than that required for a conventional circuit (14 if using transistors with emitter area of different ratio, and 32 if using transistors with the same emitter area). The required circuit area of the comparator can be reduced by about ¾.

Next, the eighth embodiment of the present invention is described below.

Figure 24:
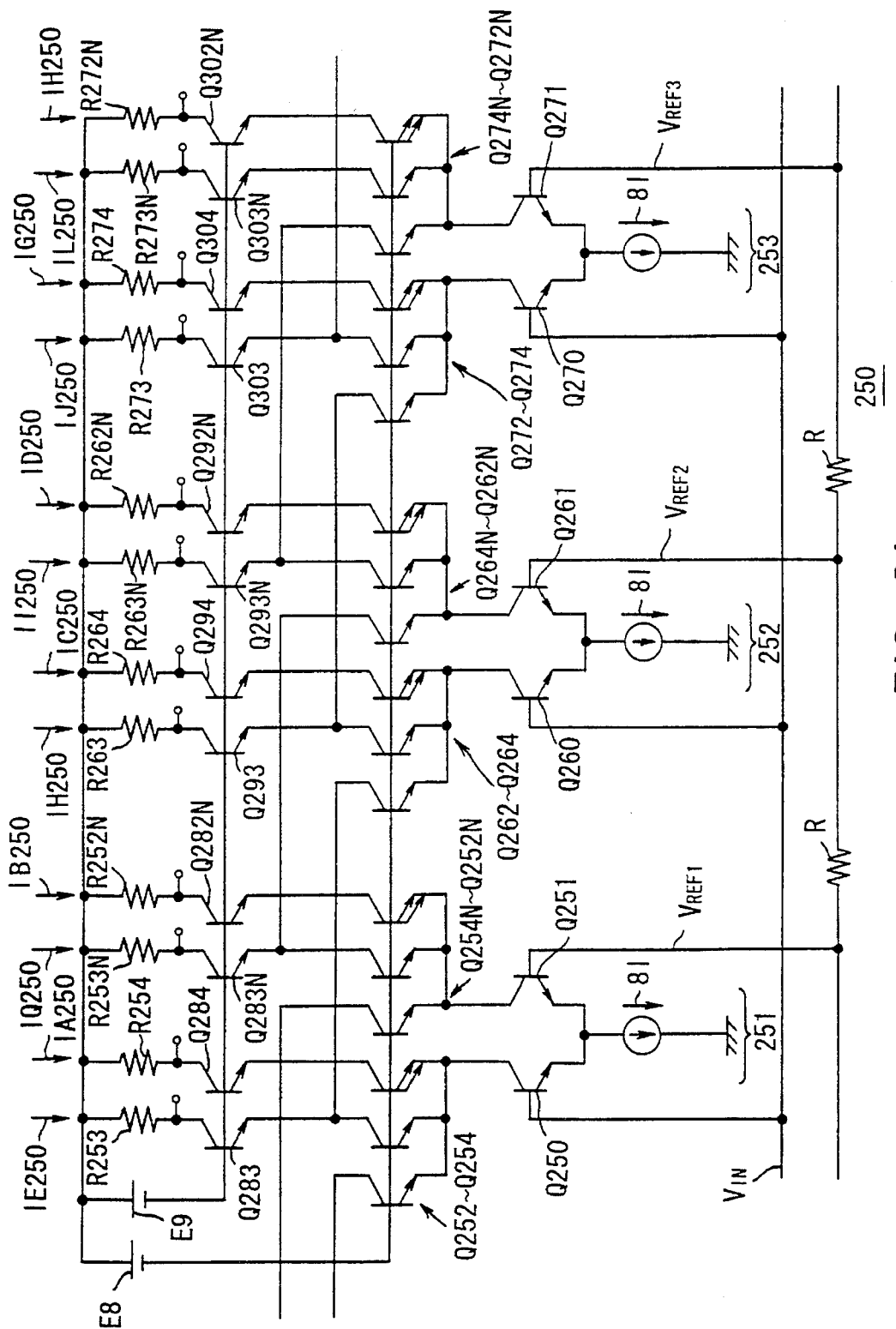
FIG. 24 is a circuit diagram showing a series/parallel A/D convertor in an eighth embodiment of the present invention.

The above embodiment in FIG. 23 is described for a case where the load resistors R213, R214, R213N, R212N, . . . are directly connected to the collectors of current dividing transistors Q213, Q214, 0213N, Q212N, . . . . However, this invention is not limited to such case, but, as shown in FIG. 24, base-connected transistors Q243, Q244, Q243N, Q242N, . . . with the same emitter area may cascade connected between the current dividing transistors Q213, Q214, Q213N, Q212N, . . . and the load resistors R213, R214, R213N, R212N, With such arrangement, the parasitic capacitance to the output terminal apparently becomes one which is half of the capacitance value of the parasitic capacitance to the above embodiment. Thus, the lower comparator section 20 can be operated at higher speed.

Next, the ninth embodiment of the present invention is described below.

Figure 25:
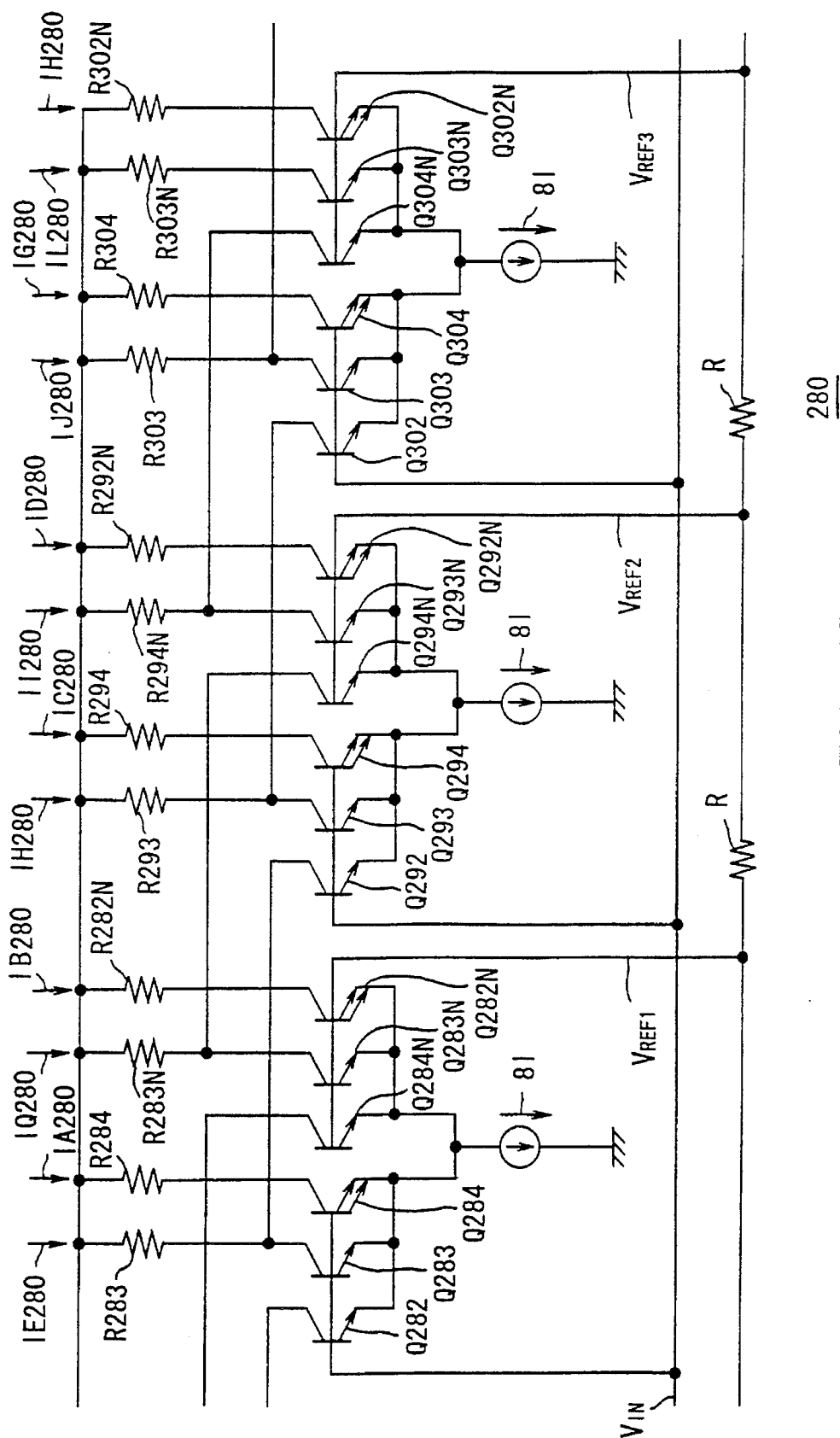
FIG. 25 is a circuit diagram showing a series/parallel A/D convertor in a ninth embodiment of the present invention.

In addition, although the above embodiment is described for a case where the transistors Q250 and Q251, . . . which constitute the differential pair for comparing the reference potentials $V_{REF1}$, . . . and the input signal $V_{IN}$ are constituted separately from the base-grounded transistors Q252, Q253, Q254, . . . for dividing the collector current which is the comparison output, this invention is not limited to such case, but, as shown in FIG. 25, the transistors Q282, Q283, and Q284 as well as Q284N, Q283N, and Q282N with the emitter area ratio of 1:1:2 may be arranged to serve as both the transistors Q250 and Q251 constituting the differential input stage 251 and the transistors Q252, Q253, Q254, Q254N, Q253N, and Q252N connected to their collectors for dividing the collector current.

In this case, the lower comparator section can be constituted with much smaller number of elements so that the circuit area required for the comparator can be reduced.

Further, the above embodiment is described for a case where the comparison output of the input signal $V_{IN}$ to the virtual reference potentials V31, V32, and V33 equally dividing two adjacent reference potentials $V_{REF1}$ and $V_{REF2}$ ($=V_{REF1}+\Delta V$) by four is found by interpolation. However, this invention is not limited to such a case, but may be widely applicable to such a case where a comparison output of the input signal $V_{IN}$ to a virtual reference potential equally dividing a reference potential by N ("N" being a natural number).

In such case, dividing the difference voltage $\Delta V$ of two reference potentials by N means dividing the difference between the intermediate potentials $\Delta V/2$ and the reference potential $V_{REF1}$ or $V_{REF2}$ by N/2.

Figure 26:
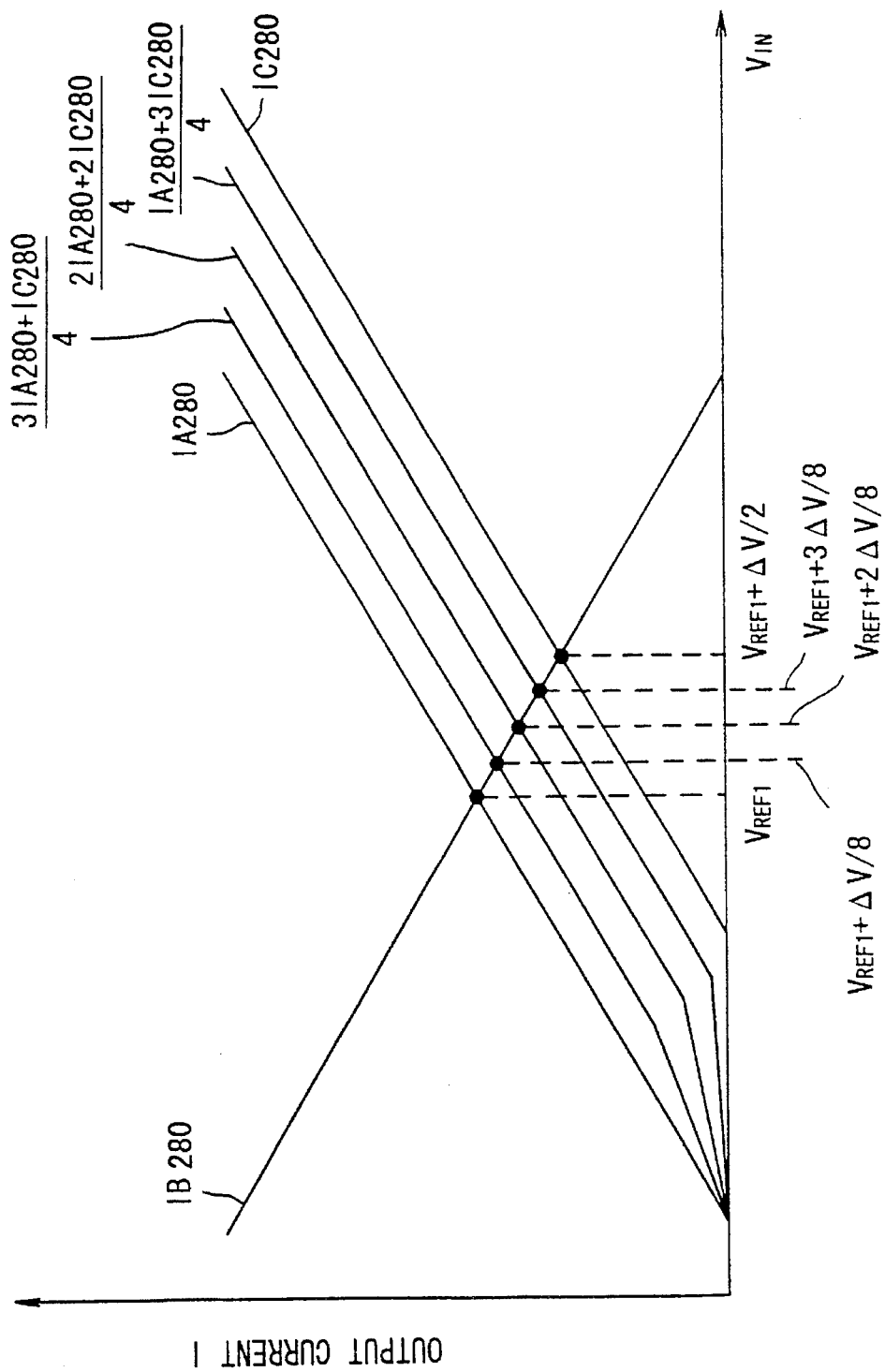
FIG. 26 is a characteristic curve diagram of the comparator of the present invention shown in FIG. 25.

For example, division by eight means equally dividing the difference $\Delta V/2$ by four as shown in FIG. 26.

Therefore, it is possible to divide the difference between the reference potential $V_{REF1}$ and the intermediate potential ($V_{REF1}+ \Delta V/2$) by N/2 by generating a composite collector current internally dividing the divided collector current IA210 and the divided collector current IB210 by (N/2)−k:k (k=0, 1, . . . N/2) based on the following equation:

$$Ik = \frac{\left(\frac{N}{2} - k\right) \cdot IA16}{\frac{N}{2}} + \frac{k \cdot IC16}{\frac{N}{2}} \quad (3)$$

and by comparing each composite collector current with the divided collector current IB210.

Similarly, it is possible to divide the difference between the intermediate potential ($V_{REF1} + \Delta V/2$) and the reference potential $V_{REF2}$ by N/2 by generating a composite collector current internally dividing the divided collector current IB210 and the divided collector current ID210 by (N/2)−k:k (k=0, 1, ... N/2) and by comparing each composite collector current with the divided collector current IC210.

The above embodiment is described for a case where the collector current is divided by cascade connecting a plurality of transistors with different emitter area ratios to differential pairs of transistors Q250 and Q251, Q260 and Q261, However, this invention is not limited to such case, but emitter resistors may be added to the emitters of transistors used for current division to suppress the variation of current ratio to a low value.

Also, the above embodiment is described for a case where the emitter area ratio of a plurality of cascade transistors Q252, Q253, and Q254 (Q254N, Q253N, and Q252N) for dividing the collector current is set to 1:1:2. However, this invention is not limited to such a ratio, but another ratio may be set.

Also, the above embodiment is described for a case where this invention is used in the comparator section of a parallel A/D convertor circuit. However, this invention is not limited to such a case, but may be widely applied to a comparator circuit for analog signals.

As described in the above, according to this invention, the composite non-inverted output current which is composed by the first and second non-inverted comparison output current at a predetermined ratio is compared to the first and second inverted comparison output current inverted relative to this composite output current by the interpolation output stage constituting the lower comparator section of the analog-to-digital convertor circuit, and the composite inverted comparison output current which is composed by the first and second inverted comparison output outputs at a predetermined ratio is compared to the first and second non-inverted comparison output current in inverted relation to this composite output current. Thus, the number of the transistors required for constituting the lower comparator section can be significantly reduced than those in the prior art so that the circuit diagram of the analog-to-digital convertor circuit can be further reduced.

Next, the tenth embodiment of the present invention is described below. In the above serial/parallel A/D convertor, the construction of the lower comparator CD51 to CD58 is described.

Figure 27:
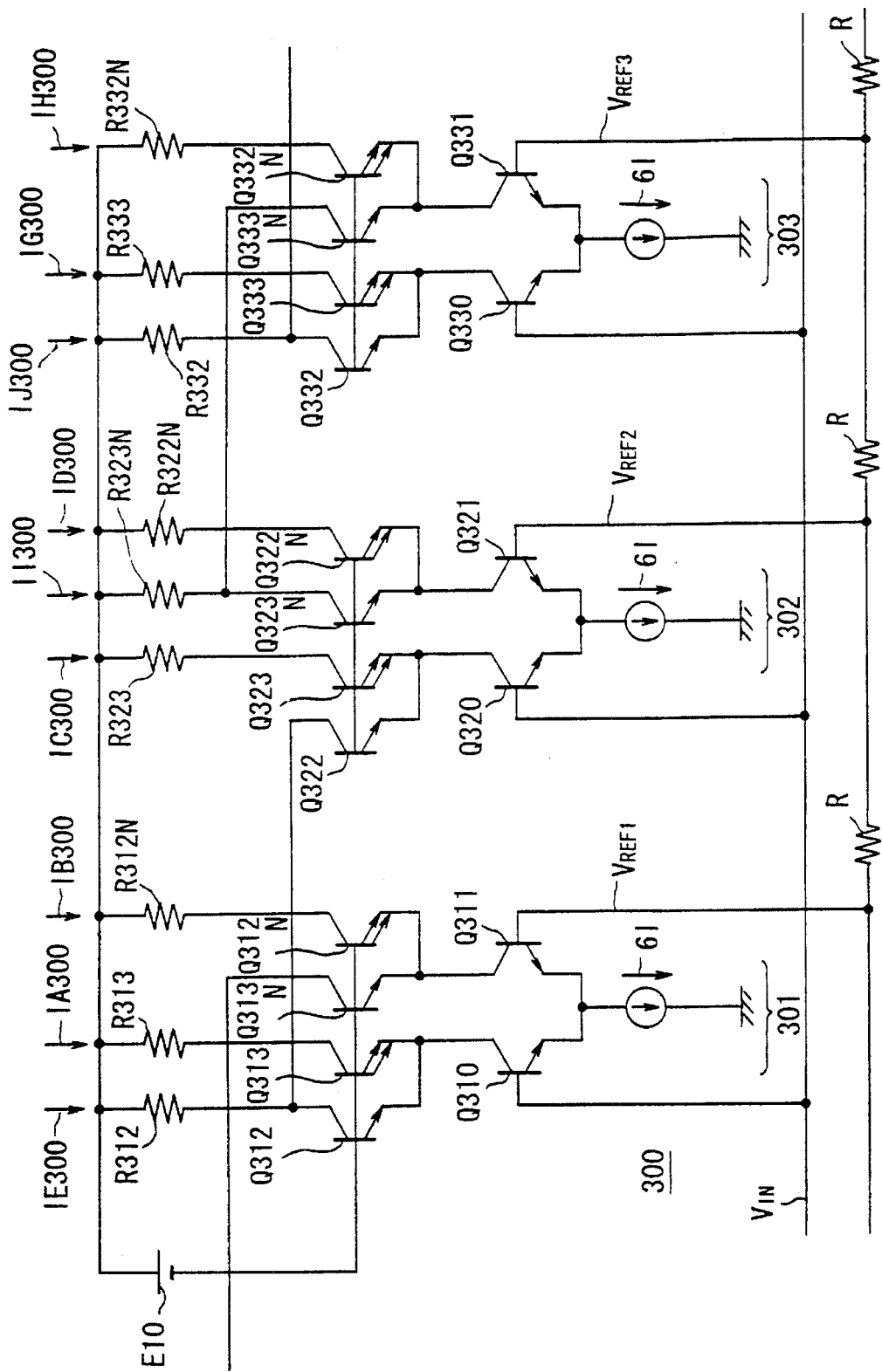
FIG. 27 is a circuit diagram of a series/parallel A/D convertor in a tenth embodiment of the present invention in which the interpolation type of comparator is used for the lower comparator.

In FIG. 27, 300 generally indicates a lower comparator section. It is arranged to obtain a comparison output of the input signal $V_{IN}$ to virtual reference potential, equally dividing reference potentials $V_{REF1}$ and $V_{REF2}$, $V_{REF2}$ and $V_{REF3}$ by four by dividing the collector current, which is a comparison output of each of three adjacent reference potentials $V_{REF1}$, $V_{REF2}$, and $V_{REF3}$, and the input signal $V_{IN}$, at a current ratio of 1:2, and then combining and adding them.

In the case of this embodiment, each differential input stage 301, 302, and 303 constituting the first stage circuit of the lower comparator has the same arrangement in which a collector current corresponding to a signal level of the input signal $V_{IN}$ to respective reference potentials $V_{REF1}$, $V_{REF2}$, and $V_{REF3}$ is fed by inputting the input signal $V_{IN}$ to one of transistors Q310, Q320, and Q330 constituting a differential pair, and supplying the reference potential to other transistors Q311, Q321, and Q322.

In this case, the collectors of transistors (Q310, Q311), (Q320, Q321), and (Q330, Q331) constituting the differential pair are cascade connected with base-grounded current dividing transistors (Q312, Q313, Q313N, Q312N), (Q322, Q323, Q323N, Q322N), and (Q332, Q333, Q333N, Q332N) with an emitter area ratio of 1:2 to divide the comparison collector current according to an emitter area ratio.

Also, each differential input stage is commonly connected with the collectors of the current dividing transistors (Q312, Q322), and (Q323N, Q333N) of the adjacent differential input stages dividing the collector current by three to obtain an output voltage by composing two sets of divided collector current mutually in a non-inverted relationship.

Thus, when assuming that the divided collector current flowing through the transistors Q313 and Q323 is IA300 and IC300, a load resistor R312 connected to the common collector of the transistors Q312 and Q322 is supplied with the composite collector current IE300 which is combination of the divided collector current IA300 and IC300 at the ratio of half to half (= A300/2+C300/2).

Similarly, when assuming that the divided collector current flowing through the transistors Q322N and Q332N is ID300 and IH300, a load resistor R323N connected to the common collector of the transistors Q323N and Q333N is supplied with the composite collector current II300 which is combination of the divided collector current ID300 and IH300 at the ratio of half to half (= ID300/2+IH300/2).

Thus, because each of current dividing transistors (Q312, Q313, Q312N), (Q322, Q323, Q322N), . . . is connected with the load resistors (R312, R313, R312N), (R322, R323, R322N), . . . with the same resistance value each other, each load resistor is provided with an output voltage corresponding to the divided collector current value divided in accordance with the emitter area ratio of the transistors and the composite current value.

In the case of this embodiment, the comparison output to the virtual reference potential dividing the potential between the reference potentials $V_{REF1}$ and $V_{REF2}$ by four can be obtained by comparing the output voltage of each load resistor.

That is, the comparison output of the input signal $V_{IN}$ to the reference potentials $V_{REF1}$ and $V_{REF2}$ can be obtained, respectively, by comparing the output voltage of the load resistors R312 and R312N, and by comparing the output voltage of the load resistors R323 and R323N.

Also, the comparison output of the input signal $V_{IN}$ to the virtual reference potential V42 (=$V_{REF1}+\Delta V/2$) dividing the difference between two reference potentials $V_{REF1}$ and $V_{REF2}$ can be obtained by comparing the output voltage of the load resistors R312N and R323.

The comparison output of the input signal $V_{IN}$ to the virtual reference potential V41 (=$V_{REF1}+\Delta V/4$) dividing the difference between the reference potential $V_{REF1}$ and the intermediate reference potential V42 by two (that is, dividing the difference between the reference potentials $V_{REF1}$ and $V_{REF2}$ by four) can be obtained by comparing the output voltage of the load resistor R312 through which the composite collector current IE300 flows and that of the load resistor R312N through which the divided collector current IB300 flows.

Similarly, the comparison output of the input signal $V_{IN}$ to the virtual reference potential V43 (=$V_{REF1} \mp \Delta V/4$) dividing the difference between the reference potential $V_{REF2}$ and the intermediate reference potential V42 by two (that is, dividing the difference between the reference potentials $V_{REF1}$ and $V_{REF2}$ by four) can be obtained by comparing the output voltage of the load resistor R312 through which the composite collector current IE300 flows and that of the load resistor R322N through which the divided collector current ID300 flows.

Thus, the comparison output of the input signal $V_{IN}$ to the virtual reference potentials V41 and V43 dividing the difference between the reference potentials $V_{REF1}$ and $V_{REF2}$ by four can be found by comparing the composite collector current IE300 non-inverted to the input signal $V_{IN}$ and the collector currents IB300 and ID300 in the inverted relationship to it.

On the other hand, it is arranged that the comparison output of the input signal $V_{IN}$ to the virtual reference potentials V51 and V53 dividing the difference between the reference potentials $V_{REF2}$ and $V_{REF3}$ adjacent to the reference potentials $V_{REF1}$ and $V_{REF2}$ by four can be found by comparing the composite collector current II300 in inverted relation to the input signal $V_{IN}$ with the collector currents IC300 and IG300 in inverted relationship thereto.

In the above arrangement, the A/D convertor circuit 200 (FIG. 20) inputs the input signal $V_{IN}$ to the upper comparators CU51 to CU53 for comparison with the reference voltages VU1 to VU3, and supplies the line signals SA to SC corresponding to the comparison outputs to the selection output section 203. Then, the reference potential dividing the reference potential interval to which the input signal $V_{IN}$ by eight and its redundancy correction interval are switched by the lower reference potential selection signals X1 to X5, and supplies to the differential pair of the first stage in the lower comparators CD51 to CD58.

Now, the operation of a four division interpolating comparator circuit will be explained when sequentially increasing the input signal $V_{IN}$ from the reference potential $V_{REF1}$ to the adjacent reference potentials $V_{REF2}$ and $V_{REF3}$ by assuming that the reference potentials $V_{REF1}$, $V_{REF2}$, and $V_{REF3}$ are applied to the differential pairs of the first stage in CD51, CD53, and CD55 of the lower comparators CD51 to CD58.

First, in the case where the input signal $V_{IN}$ exceeds the reference potential $V_{REF1}$, the values of output voltage of the load resistor R313 through which the divided collector current IA300 flows and the load resistor R312N through which the divided collector current IB300 flows are inverted, and then the comparison output of the voltage values is newly inverted.

In addition, when the voltage value of input signal $V_{IN}$ gradually increases and exceeds the virtual reference potential V41, then the output voltage of the load resistor R312N through which the divided collector IB300 flows and that of the load resistor R312 through which the composite collector current IE300 (=IA300/2+IB300/2) flows are inverted, and the comparison 4 output of the voltage values is newly inverted.

Then, similarly, when the voltage value of input signal $V_{IN}$ exceeds the virtual reference potentials V42 and V43, respectively, the output voltage of the load resistors R312N and R323 through which the divided collector currents IB300 and IC300 flow, respectively, is inverted, and the output voltage of the load resistors R322N and R312 through which the divided collector current ID300 and the composite collector current IE300 (=IA300/2+IC300/2) flow is inverted so that their comparison outputs are sequentially inverted.

Thus, the lower comparator section 300 can obtain the comparison outputs to two actually applied reference potentials $V_{REF1}$ and $V_{REF2}$ as well as to the virtual reference potentials V41, V42, and V43 dividing them by four.

Figure 28:
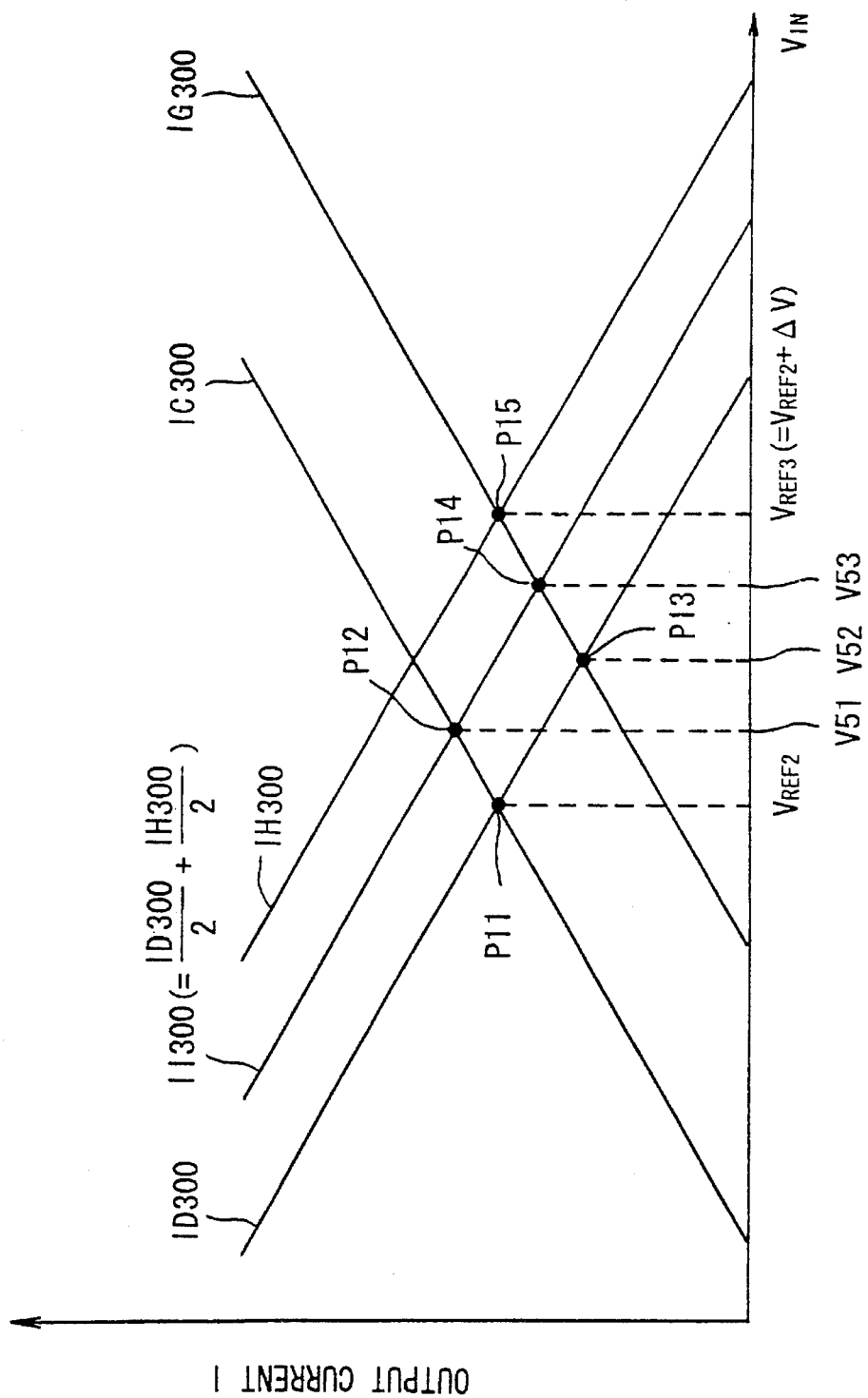
FIG. 28 is a characteristic curve diagram of the comparator shown in FIG. 27.

Then, for the potential between the adjacent reference potentials $V_{REF2}$ and $V_{REF3}$, it is possible to detect by inversion of the output voltage of the load resistor R323 through which the divided collector current IC300 flows and that of the load resistor R322N through which the divided collector current ID300 flows the fact that the voltage value of the input signal $V_{IN}$ exceeds the reference potential $V_{REF2}$ (the intersection P11 in FIG. 28), and to find by inversion the output voltage of the load resistor R323N through which the composite collector current II300 flows and that of the load resistor R323 through which the divided collector current IC300 flows the fact that the input signal $V_{IN}$ exceeds the virtual reference potential V51.

At the same time, it is possible to sequentially find from the comparison output of the output voltage of the load resistors R322N and R332 the fact that the input signal $V_{IN}$ exceeds the virtual reference potential V52 (the intersection P13 in FIG. 28), and from the comparison output of the output voltage of the load resistors R323N and R333 the fact that input signal $V_{IN}$ exceeds the virtual reference potential V53.

Thus, it is possible to obtain the comparison outputs of the input signal $V_{IN}$ to the virtual reference potentials V41, V42, and V43, as well as V51, V52, and V53 equally dividing the actually applied reference potentials $V_{REF1}$ and $V_{REF2}$, as well as $V_{REF2}$ and $V_{REF3}$ by four by comparing one of composite collector currents IE300 or II300, which are composed by in a ratio of half to half the divided collector currents in the non-inverted relationship in each other of the divided collector currents of each collector flowing based on the result of comparison between the adjacent reference potential and the input signal $V_{IN}$, and the divided collector currents IB300 and ID300, or IC300 and IG300 in the inverted relationship to this composite collector current.

Similar comparison outputs can be obtained for the other lower comparators CD53, CD54 to CD58. The lower encoder 54 is inputted with four comparison outputs from eight sets of lower comparators CD51 to CD58, respectively.

Thus, the A/D convertor circuit 200 can obtain an A/D converted output with a resolution of six bits by using a reference voltage generator circuit 201 of a similar arrangement to a conventional reference voltage generator circuit.

According to the above arrangement, it is possible to obtain the comparison outputs to the virtual reference potentials V41, V42, and V43, or V51, V52, and V53 dividing the difference between the adjacent reference potentials $V_{REF1}$ and $V_{REF2}$, or $V_{REF2}$ and $V_{REF3}$ by four by adding in a ratio of half to half two divided collector currents IA300 and IC300, or ID300 and IH300 in the non-inverted or inverted relationship to the input signal $V_{IN}$. Of the collector currents flowing based on the result of comparison between the adjacent reference potentials $V_{REF1}$ and $V_{REF2}$, or $V_{REF2}$ and $V_{REF3}$ and the input signal $V_{IN}$ to generate the composite collector current IE300 (IA300/2+IC300/2) or II300 (=ID300/2+IH300/2), and by comparing the divided collector currents IB300 and ID300, or IC300 and IG300 in the inverted relationship to each composite collector current.

This enables it to provide the A/D convertor circuit 200 with lager difference voltage than that actually applied to the differential pair so as to reduce the influence of base-emitter voltage $\Delta V_{BE}$. In addition, the number of elements necessary for constituting a differential input stage is sufficient to be four when using transistors with different emitter area ratio, or six when using transistors with the same emitter area so that the A/D convertor circuit can be attained with significantly smaller number of transistors than those necessary for a conventional circuit (14 when using transistors with different emitter area ratio, and 32 when using transistors with the same emitter area).

Next, the eleventh embodiment of the present invention is described below.

Figure 29:
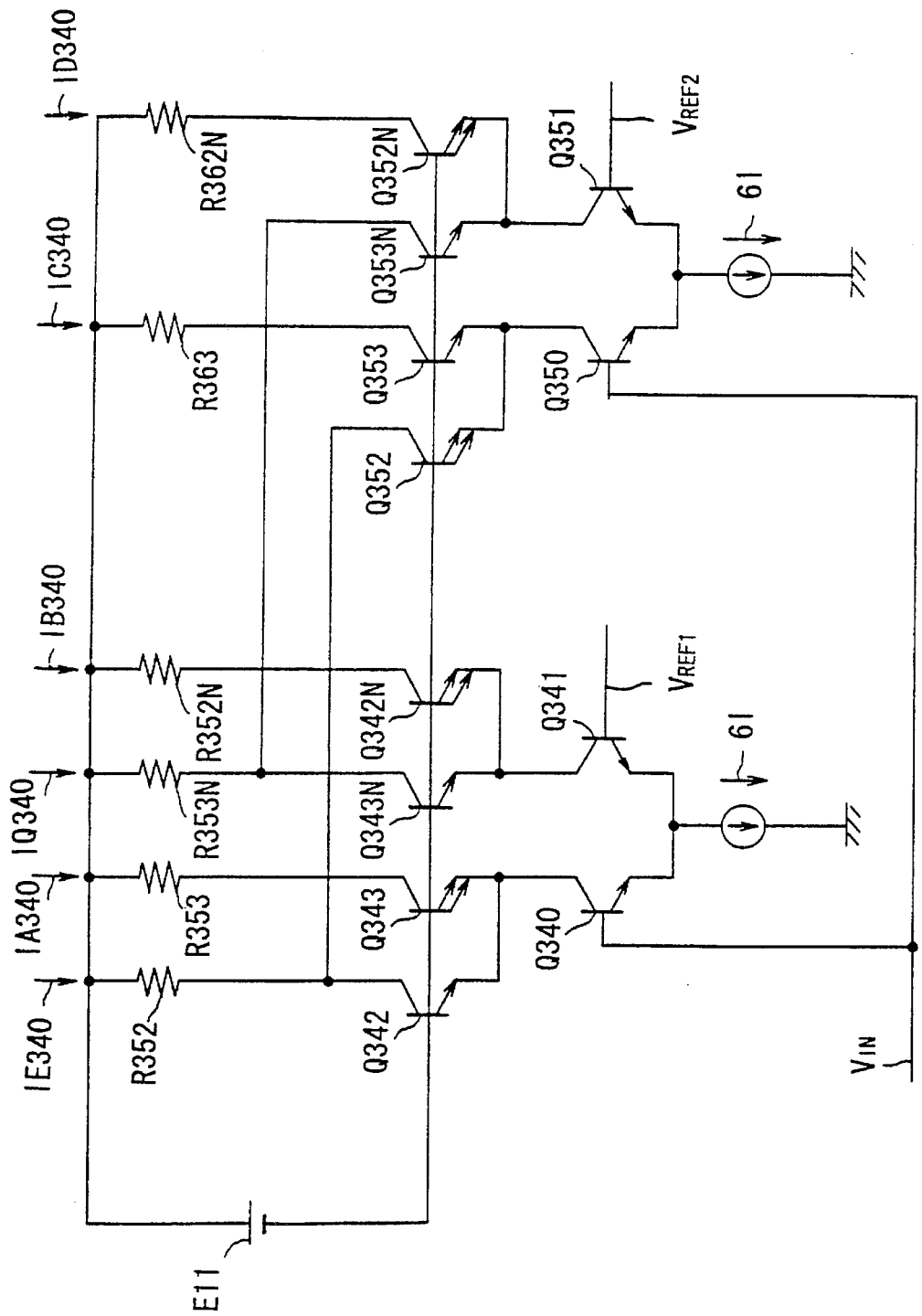
FIG. 29 is a circuit diagram of the comparator which is used for the lower comparator of the series/parallel A/D convertor in an eleventh embodiment of the present invention.

The above embodiment is described for a case where the divided collector current (IC300/2) dividing in a ratio of half to half the collector current IC300 in non-inverted relation to the input signal $V_{IN}$ of the comparison outputs of the input signal $V_{IN}$ to the reference potential $V_{REF2}$ is supplied to the differential input stage 301 for finding the comparison output to the lower reference potential $V_{REF1}$, and the divided collector current (ID340/2) dividing in a ratio of half to half the collector current ID340 in inverted relation to the input signal $V_{IN}$ is supplied to the differential input stage 303 for finding the comparison output to the upper reference potential $V_{REF3}$. However, this invention is not limited to this, but, as shown in FIG. 29 where the same references refer to components corresponding to those in FIG. 27, one set of divided collector currents (IC340/2 and ID340/2) may be composed with the divided collector current of the lower or upper differential input stage.

In this case, because, one set of composite collector currents IE340 and IQ340 is simultaneously generated, it is sufficient to find the comparison output of the input signal $V_{IN}$ to the virtual reference potentials V61, V62, and V63 by using only one of either the composite collector current IE340 or I0340.

Further, the above embodiment (FIG. 29) is described for a case where the load resistors R352, R353, R352N, . . . are directly connected to the collectors of current dividing transistors Q342, Q343, Q343N, Q342N, . . . . However, this invention is not limited to this, but base-connected transistors with the same emitter area may cascade connected between the current dividing transistors Q342, Q343, Q343N, Q342N, and the load resistors R352, R353, R352N.

With such arrangement, the parasitic capacitance to the output terminal apparently becomes one which is half of the capacitance value of the parasitic capacitance to the above embodiment. Thus, the lower comparator section 200 can be operated at higher speed.

Furthermore, the above embodiment is described for a case where the transistors Q340 and 0341, . . . constituting the differential pair comparing the reference potentials $V_{REF1}$, . . . and the input signal $V_{IN}$ are constituted separately from the base-grounded transistors Q342, Q343, Q343N, Q342N, . . . dividing the collector current, which is the comparison output, this invention is not limited to such a case, but it may be possible that the input signal $V_{IN}$ is supplied in parallel to the bases of the base-grounded transistors Q342 and Q343, the reference potential $V_{REF1}$ is supplied to the bases of other transistors Q343N and Q342N, and the emitters of these four transistors are connected to a common constant current source so that the transistors for comparison are also served as those for current division.

In this case, the lower comparator section can be constituted with much smaller number of elements so that the circuit area required for the comparator can be reduced.

Further, the above embodiment is described for a case where the comparison output of the input signal $V_{IN}$ to the virtual reference potentials V61, V62, and V63 equally dividing two adjacent reference potentials $V_{REF1}$ and $V_{REF2}$ (=$V_{REF1}$+$\Delta V$) by four is found by interpolation. However, this invention is not limited to this, but may be widely applicable to such a case where a comparison output of the input signal $V_{IN}$ to a virtual reference potential equally dividing a reference potential by N (N being a natural number).

In such case, dividing the difference voltage V of two reference potentials by N means dividing the difference between the intermediate potential $\Delta V/2$ and the reference potential $V_{REF1}$ or $V_{REF2}$ by N/2.

Figure 30:
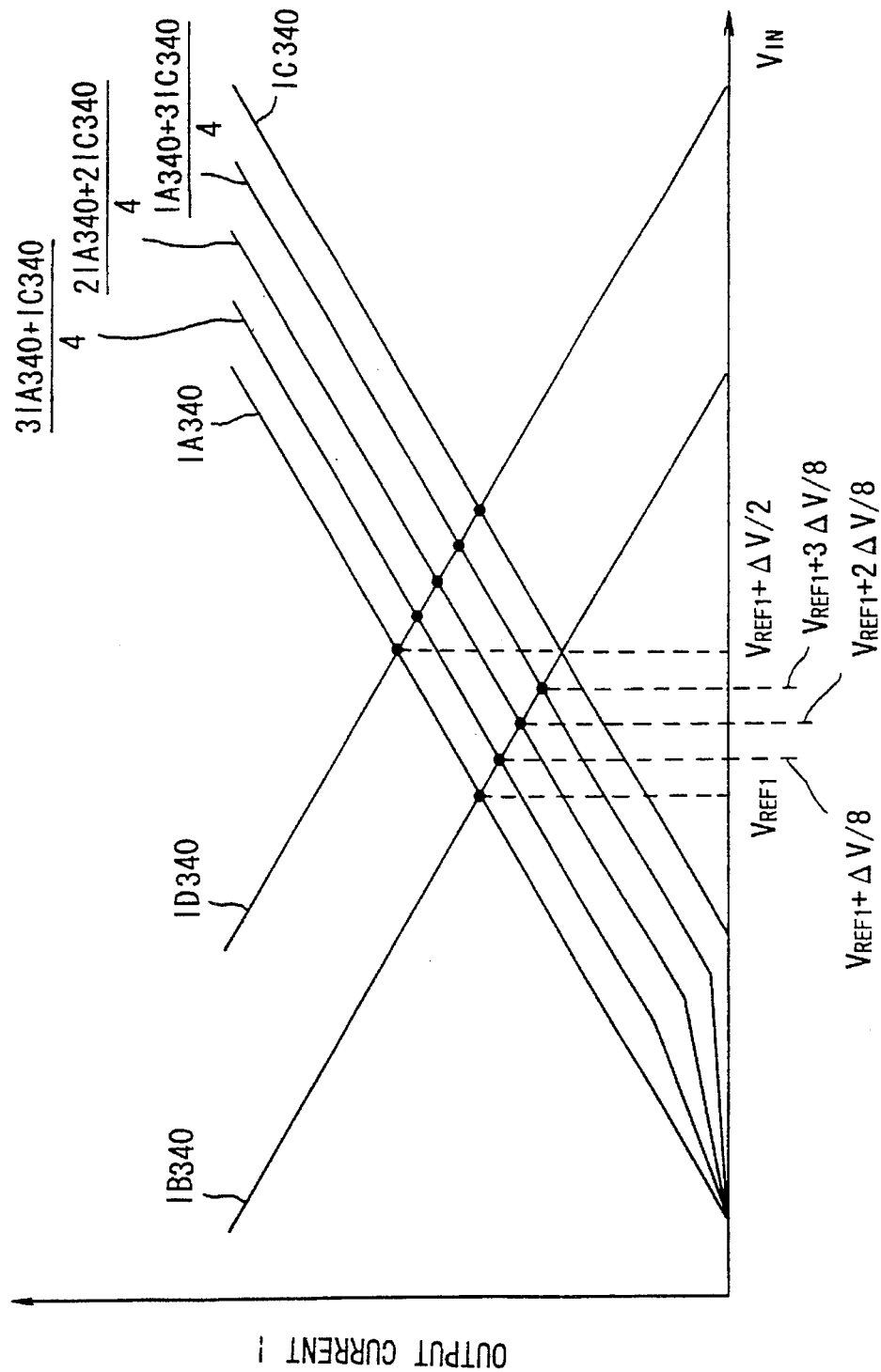
FIG. 30 is a characteristic curve diagram of the comparator shown in FIG. 29.

For example, division by eight means equally dividing the difference $\Delta V/2$ by four as shown in FIG. 30.

Therefore, it is possible to divide the difference between the reference potentials $V_{REF1}$ and the intermediate potential ($V_{REF1}$+$\Delta V/2$) by N/2 by generating a composite collector current internally dividing the divided collector current IA230 and the divided collector current IC230 by (N/2)–k:k (k=0, 1, . . . N/2) based on the following equation:

$$Ik = \frac{\left(\frac{N}{2} - k\right) \cdot IA340}{\frac{N}{2}} + \frac{k \cdot IC340}{\frac{N}{2}} \qquad (4)$$

and by comparing each composite collector current with the divided collector current IB340.

Similarly, it is possible to divide the difference between the intermediate potential (VREFI+$\Delta V/2$) and the reference potential by N/2 by generating a composite collector current internally dividing the divided collector current IA340 and the divided collector current IC340 by (N/2)–k:k (k=0, 1, . . . N/2) and by comparing each composite collector current with the divided collector current ID340.

Further, the above embodiment is described for a case where the collector current is divided by cascade connecting a plurality of transistors with different emitter area ratios to differential pairs of transistors Q340 and Q341, Q350 and Q351. However, this invention is not limited to this, but emitter resistors may be added to the emitters of transistors used for current division to suppress the variation of current ratio to a low value.

Also, the above embodiment is described for a case where the emitter area ratio of the transistors Q342 and Q343 (Q343N and Q342N) for dividing the collector current is set to 1:2. However, this invention is not limited to this, but another ratio may be set.

Also, the above embodiment is described for a case where this invention is used in the comparator section of a two step parallel A/D convertor circuit. However, this invention is not limited to this, but may be widely applied as a serial/parallel comparing stage.

As described, according to this invention, the interpolation output stage in the lower comparison section constituting the analog-to-digital convertor circuit compares either one of the composite non-inverted output current, which is composed by the first and second non-inverted comparison output currents in a predetermined ratio, or the composite inverted output current, which is composed by the first and second inverted comparison output currents in a predetermined ratio, with the comparison output currents, which are inverted relative to the composite output current. This enables it to significantly reduce the number of transistors necessary to constitute the lower comparator section than those in the prior art so that the circuit area of analog-to-digital convertor circuit can be reduced.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. A comparator circuit, comprising:

a first differential input stage for inputting an input signal and a first reference signal, and outputting a first inverted comparison output current corresponding to said first reference signal and a first non-inverted comparison output current;

a second differential input stage for inputting said input signal and a second reference signal, and outputting a second inverted comparison output current corresponding to said second reference signal and a second non-inverted comparison output current;

a current divider means for dividing said first and second inverted comparison output current, and said non-inverted comparison output current in predetermined ratios, respectively; and an interpolation output means for generating a composite inverted output current by adding said divided first and second inverted comparison output current in a predetermined ratio, and generating a composite non-inverted output current by adding said first and second non-inverted comparison output current in a predetermined ratio, and then said interpolation output means comparing said composite inverted output current and the second non-inverted comparison output current which is in inverted relation to said composite inverted output current, comparing said composite non-inverted output current and the first inverted output current which is in inverted relation to said composite non-inverted output current, and comparing said first inverted output current and said second non-inverted output current, respectively, or said interpolation output means comparing said composite inverted output current and the first non-inverted comparison output current which is in inverted relation to said composite inverted output current, comparing said composite non-inverted output current and the second inverted output current which is in said composite non-inverted output current, and comparing said second inverted output current and said first non-inverted output current, respectively, as a result said interpolation output means obtaining a comparison result of said input signal with a virtual reference signal existing between said first and second reference signals.

2. A comparator circuit according to claim 1, wherein:

said first differential input stage consists of a differential pair of first and second transistors, and outputs the result of comparison between the input signal and the first reference signal as the first inverted comparison output current and the first non-inverted comparison output current;

said second differential input stage consists of a differential pair of third and fourth transistors, and outputting the result of comparison between said input signal and said second reference signal as the second inverted comparison output current and the second non-inverted comparison output current;

said current divider means consists of fifth, sixth, and seventh as well as eighth, ninth, and tenth base ground transistors cascade connected to said first differential input stage, and eleventh, twelfth, and thirteenth, as well as fourteenth, fifteenth, and sixteenth transistors cascade connected to said second differential input stage, and divides said first inverted comparison output current and said first non-inverted comparison output current into a ratio of 1:1:2, respectively, and divides said second inverted comparison output current and said second non-inverted comparison output current into a ratio of 1:1:2, respectively; and said interpolation output means generates the composite inverted output current, which is obtained by adding said first and second inverted comparison output current in a ratio of half to half, by commonly connecting the collectors of the sixth and eleventh transistors, compares said composite inverted output current with said first and second non-inverted comparison output current, generates the composite non-inverted output current which is obtained by adding said first and second non-inverted comparison output current in a ratio of half to half, by commonly connecting the collectors of the tenth and fourth transistors, and obtains the result of comparison of the input signal to a virtual reference signal existing between the first and second reference signals by comparing said composite non-inverted output current with said first and second inverted comparison current.

3. A comparator circuit according to claim 2, wherein:

said interpolation output means cascade connects the seventeenth and eighteenth, the nineteenth and twentieth, and the twenty-first and twenty-second transistors having the same emitter area and base grounded between output terminals, through which said composite inverted output current, said first inverted comparison output current and said composite non-inverted output current, and said first non-inverted comparison output current, said second inverted comparison output current and second non-inverted comparison current flow, respectively, as well as each of the current dividing transistors.

4. A comparator circuit, comprising:

a means for inputting an input signal and a first reference signal, and outputting a first inverted comparison output current corresponding to said first reference signal and a first non-inverted comparison output current, for inputting said input signal and a second reference signal, and outputting a second inverted comparison output current corresponding to said second reference signal and a second non-inverted comparison output current, and for dividing said first and second inverted comparison output current, and said non-inverted comparison output current in predetermined ratios, respectively; and an interpolation output means for generating a composite inverted output current by adding said divided first and second inverted comparison output current in a predetermined ratio, and generating a composite non-inverted output current by adding said first and second non-inverted comparison output current in a predetermined ratio, and then said interpolation output means comparing said composite inverted output current and the second non-inverted comparison output current which is in inverted relation to said composite inverted output current, comparing said composite non-inverted output current and the first inverted output current which is in inverted relation to said composite non-inverted output current, and comparing said first inverted output current and said second non-inverted output current, respectively, or said interpolation output means comparing said composite inverted output current and the first non-inverted comparison output current which is in inverted relation to said composite inverted output current, comparing said composite non-inverted output current and the second inverted output current which is in said composite non-inverted output current, and comparing said second inverted output current and said first non-inverted output current, respectively, as a result said interpolation output means obtaining a comparison result of said input signal with a virtual reference signal existing between said first and second reference signals.

5. A comparator circuit comprising:

a first differential input stage inputting an input signal and a first reference signal and outputting a first inverted comparison output current corresponding to the first reference signal and a first non-inverted comparison output current;

a second differential input stage inputting said input signal and a second reference signal outputting a second inverted comparison output current corresponding to said second reference signal and a second non-inverted comparison output current;

a current divider means for dividing said first and second inverted comparison output current, and said first and second non-inverted comparison output currents in predetermined ratios; and an interpolation output means for generating a composite inverted comparison output current by adding said divided first and second inverted comparison output current in a predetermined ratio, or generating a composite non-inverted output current by adding said first and second non-inverted comparison output currents in a predetermined ratio, and comparing said composite inverted output current and the first and second non-inverted comparison output currents, which are in inverted relation to said composite inverted output current, or comparing said composite non-inverted output current and the first and second inverted output currents, which are in inverted relation to said composite non-inverted output current, respectively, as a result said interpolation output means obtaining a result of comparison of said input signal to a virtual reference signal existing between said first and second reference signals.

6. A comparator circuit according to claim 5, wherein:

said interpolation output means adds said first and second inverted comparison currents, or said first and second non-inverted comparison currents in a ratio of N/2–k:k (where K s 0, 1, . . . , N/2) to generate a composite inverted output current or composite non-inverted output current, compares said composite inverted output current and said first and second non-inverted comparison output currents, or said composite non-inverted output current and said first and second inverted comparison output currents, as a result said interpolation output means obtaining a result of comparison of said input signal to N–1 virtual reference signals existing between said first and second reference signals.

7. A comparator circuit according to claim 5, wherein:

said first differential input stage consists of a differential pair of first and second transistors, and outputs a result of comparison between said input signal and said first reference signal as the first inverted comparison output current and the first non-inverted comparison output current;

said second differential input stage consists of third and fourth transistors, and output a result of comparison between said input signal and said second reference signal as the second inverted comparison output current and the second non-inverted comparison output current;

said current divider means consists of fifth, and sixth, as well as seventh, and eighth base-grounded transistors cascade connected to said first differential input stage, and ninth, and tenth, as well as eleventh, and twelfth transistors cascade connected to said second differential input stage, and divides said first inverted comparison output current and said first non-inverted comparison output current into a ratio of 1:2, respectively, and divides said second inverted comparison output current and said second non-inverted comparison output current into a ratio of 1:2, respectively;

said interpolation output means generates the composite inverted output current, which is sum of said first and second inverted comparison output currents in a ratio of half to half, by commonly connecting the collectors of said seventh and eleventh transistors, compares said composite inverted output current with said first and second non-inverted comparison output currents, or generates the composite non-inverted output current which is sum of said first and second non-inverted comparison currents in a ratio of half to half, by commonly connecting the collectors of said fifth and ninth transistors, and compares said composite non-inverted output current with said first and second inverted comparison output currents, as a result said interpolation output means obtains a result of comparison of said input signal to a virtual reference signal existing between said first and second reference signals by comparing said composite non-inverted output current with said first and second inverted comparison currents.

8. A comparator circuit according to claim 5, wherein:

said first differential input stage consists of a differential pair of first and second transistors, and outputs a result of comparison between said input signal and said first reference signal as the first inverted comparison output current and the first non-inverted comparison output current;

said second differential input stage consists of third and fourth transistors, and outputting a result of comparison between said input signal and said second reference signal as the second inverted comparison output current and the second non-inverted comparison output current;

said current divider means consists of fifth, and sixth, as well as seventh and eighth base-grounded transistors cascade connected to said first differential input stage, and ninth and tenth, as well as eleventh and twelfth transistors cascade connected to said second differential input stage, and divides said first inverted comparison output current and said first non-inverted comparison output current into a ratio of 1:2, respectively, and divides said second inverted comparison output current and said second non-inverted comparison output current into a ratio of 1:2, respectively;

said interpolation output means generates the composite inverted output current, which is sum of said first and second inverted comparison output currents in a ratio of half to half, by commonly connecting the collectors of said seventh and eleventh transistors, generates the composite non-inverted output current which is sum of said first and second non-inverted comparison current in a ratio of half to half, by commonly connecting the collectors of said fifth and ninth transistors, compares either one of said composite inverted output current or said composite non-inverted output current with the first and second non-inverted comparison output currents, or said first and second inverted comparison output currents, as a result said interpolation output means obtains a result of comparison of said input signal to a virtual reference signal existing between said first and second reference signals by comparing said composite non-inverted output current with said first and second inverted comparison currents.

9. A serial/parallel analog-to-digital convertor circuit for performing the operation of conversion from analog signals to digital data in a plurality of stages, wherein:

a lower comparison section used for the operation of conversion comprising: a first differential input stage for inputting an input signal and a first reference signal, and outputting a first inverted comparison output current corresponding to said first reference signal and a first non-inverted comparison output current;

a second differential input stage for inputting said input signal and a second reference signal, and outputting a second inverted comparison output current to said second reference signal and a second non-inverted comparison output current;

a current divider means for dividing said first and second inverted comparison output current into the non-inverted comparison output current in predetermined ratios, respectively; and an interpolation output means for generating a composite inverted output current by adding said divided first and second inverted comparison output current in a predetermined ratio, generating a composite non-inverted output current by adding said first and second non-inverted comparison output current in a predetermined ratio, and then comparing said composite inverted output current and second non-inverted comparison output current, which is inverted relative to said composite inverted output current, said composite non-inverted output current and the first inverted output current, which is inverted relative to said composite non-inverted output current, said first inverted output current and said second non-inverted output current, respectively, or said interpolation output means comparing said composite inverted output current and first non-inverted comparison output current which is in inverted relation to said composite inverted output current, said composite non-inverted output current and second inverted output current which is in inverted relation to said composite non-inverted output current, said second inverted output current and said first non-inverted output current, respectively, as a result said interpolation output means obtaining a result of comparison of the input signal to a virtual reference signal existing between the first and second reference signals.

10. A serial/parallel analog-to-digital convertor circuit for performing the operation of conversion from analog signals to digital data in a plurality of stages, wherein:

a lower comparison section used for the operation of conversion comprising: means for inputting an input signal and a first reference signal, and outputting a first inverted comparison output current corresponding to said first reference signal and a first non-inverted comparison output current, inputting said input signal and a second reference signal and outputting a second inverted comparison output current to said second reference signal and a second non-inverted comparison output current, and dividing said first and second inverted comparison output current into the non-inverted comparison output current in predetermined ratios, respectively; and an interpolation output means for generating a composite inverted output current by adding said divided first and second inverted comparison output current in a predetermined ratio, generating a composite non-inverted output current by adding said first and second non-inverted comparison output current in a predetermined ratio, and then comparing said composite inverted output current and second non-inverted comparison output current, which is inverted to said composite inverted output current, said composite non-inverted output current and the first inverted output current, which is inverted to said composite non-inverted output current, said first inverted output current and said second non-inverted output current, respectively, or said interpolation output means comparing said composite inverted output current and first non-inverted comparison output current which is in inverted relation to said composite inverted output current, said composite non-inverted output current and second inverted output current which is in inverted relation to said composite non-inverted output current, said second inverted output current and said first non-inverted output current, respectively, as a result said interpolation output means obtaining a result of comparison of the input signal to a virtual reference signal existing between the first and second reference signals.

11. An analog-to-digital convertor circuit according to claim 10, wherein:

said first differential input stage consists of a differential pair of first and second transistors, and outputs a result of comparison between said input signal and said first reference signal as the first inverted comparison output current and the first non-inverted comparison output current;

said second differential input stage consists of a differential pair of third and fourth transistors, and outputs a result of comparison between said input signal and said second reference signal as the second inverted comparison output current and the second non-inverted comparison output current;

said current divider means consists of fifth, sixth, and seventh as well as eighth, ninth, and tenth transistors of base ground cascade connected to said first differential input stage, and eleventh, twelfth, and thirteenth, as well as fourteenth, fifteenth, and sixteenth transistors cascade connected to said second differential input stage, and dividing said first inverted comparison output current and said first non-inverted comparison output current into a ratio of 1:1:2, respectively, and divides said second inverted comparison output current and said second non-inverted comparison output current into a ratio of 1:1:2, respectively; and said interpolation output means generates the composite inverted output current, which is obtained by adding said first and second inverted comparison output current in a ratio of half to half, by commonly connecting the collectors of the sixth and eleventh transistors, compares said composite inverted output current with said first and second non-inverted comparison output current, generates the composite non-inverted output current which is obtained by adding said first and second non-inverted comparison current in a ratio of half to half, by commonly connecting the collectors of the tenth and fourth transistors, and obtains a result of comparison of said input signal to a virtual reference signal existing between the first and second reference signals by comparing said composite non-inverted output current with said first and second inverted comparison current.

12. An analog-to-digital convertor circuit according to claim 11, wherein:

said interpolation output means cascade connects the seventeenth and eighteenth, the nineteenth and twentieth, and the twenty-first and twenty-second transistors having the same emitter area and base grounded between output terminals, through which said composite inverted output current, said first inverted comparison output current and said composite non-inverted output current, and said first non-inverted comparison output current, said second inverted comparison output current and second non-inverted comparison current flow, respectively, and each of the current dividing transistors.

* * * * *